US007764454B2

(12) United States Patent
Roshchin et al.

(10) Patent No.: US 7,764,454 B2
(45) Date of Patent: Jul. 27, 2010

(54) EXCHANGE-BIAS BASED MULTI-STATE MAGNETIC MEMORY AND LOGIC DEVICES AND MAGNETICALLY STABILIZED MAGNETIC STORAGE

(75) Inventors: Igor V. Roshchin, San Diego, CA (US); Oleg Petracic, Oberhausen (DE); Rafael Morales, Asturias (ES); Zhi-Pan Li, La Jolla, CA (US); Xavier Batlle, Barcelona (ES); Ivan K. Schuller, San Diego, CA (US)

(73) Assignee: The Regents of the University of California, Oakland, CA (US)

( * ) Notice: Subject to any disclaimer, the term of this patent is extended or adjusted under 35 U.S.C. 154(b) by 640 days.

(21) Appl. No.: 11/632,335

(22) PCT Filed: Jul. 13, 2005

(86) PCT No.: PCT/US2005/025129

§ 371 (c)(1),
(2), (4) Date: Jan. 12, 2007

(87) PCT Pub. No.: WO2006/017367

PCT Pub. Date: Feb. 16, 2006

(65) Prior Publication Data

US 2008/0084627 A1   Apr. 10, 2008

Related U.S. Application Data

(60) Provisional application No. 60/587,789, filed on Jul. 13, 2004.

(51) Int. Cl.
  *G11B 5/02* (2006.01)
(52) U.S. Cl. ...................................................... 360/59
(58) Field of Classification Search .................. None
  See application file for complete search history.

(56) References Cited

U.S. PATENT DOCUMENTS

| 3,521,294 | A | * | 7/1970 | Treves ......................... 360/59 |
| 4,385,273 | A |   | 5/1983 | Lienhard et al. |
| 5,889,641 | A | * | 3/1999 | Belser et al. ................. 360/313 |
| 6,317,280 | B1 | * | 11/2001 | Nakajima et al. ............. 360/59 |
| 6,327,227 | B1 | * | 12/2001 | Katayama ................ 369/13.17 |
| 6,532,125 | B1 | * | 3/2003 | Hamann et al. ............... 360/59 |

(Continued)

FOREIGN PATENT DOCUMENTS

JP         61-104442         5/1986

(Continued)

OTHER PUBLICATIONS

International Search Report and Written Opinion dated Jun. 16, 2006 for PCT/US2005/25129, published as WO 2006/017367, and entitled: "Exchange-Bias Based Multi-State Magnetic Memory and Logic Devices and Magnetically Stabilized Magnetic Storage" (7 pages).

(Continued)

*Primary Examiner*—K. Wong
(74) *Attorney, Agent, or Firm*—Fish & Richardson P.C.

(57) ABSTRACT

Magnetic materials and methods for using ferromagnetic and antiferromagnetic coupling and exchange bias for binary and multistate magnetic memory device.

41 Claims, 15 Drawing Sheets

U.S. PATENT DOCUMENTS

| | | | |
|---|---|---|---|
| 6,777,730 B2 * | 8/2004 | Daughton et al. | 257/295 |
| 6,830,837 B2 * | 12/2004 | Kanbe et al. | 428/811.2 |
| 6,834,026 B2 * | 12/2004 | Fullerton et al. | 369/13.1 |
| 7,502,188 B2 * | 3/2009 | Inomata et al. | 360/55 |
| 2004/0086750 A1 * | 5/2004 | De Haas et al. | 428/692 |
| 2006/0062132 A1 * | 3/2006 | Van Kesteren | 369/275.1 |
| 2006/0147758 A1 * | 7/2006 | Jung et al. | 428/828.1 |
| 2007/0109838 A1 * | 5/2007 | Zheng et al. | 365/158 |

FOREIGN PATENT DOCUMENTS

| | | |
|---|---|---|
| JP | 62-184644 | 8/1987 |
| JP | 1-220239 | 9/1989 |
| JP | 8-273222 | 10/1996 |
| WO | WO 02/084647 | 10/2002 |
| WO | WO 2006/017367 | 2/2006 |

OTHER PUBLICATIONS

Aladyshkin, A. Yu. et al., "Domain-wall superconductivity in hybrid superconductor-ferromagnet structures," Phys. Rev. B 68: 184508-1-184508-7, (2003).

Berkowitz, A.E. and K. Takano, "Exchange anisotropy—a review," J. Magn. Magn. Mater. 200: 552-570 (1999).

Chien, C.L., et al., "Hybrid domain walls and antiferromagnetic domains in exchange-coupled ferromagnet/antiferromagnet bilayers," Phys.Rev. B. 68: 014418-1-014418-5 (2003).

Cowburn, R.P. "Superparamagnetism and the future of magnetic random access memory," J. Appl. Phys. 93(11): 9310-9315 (2003).

Eisenmenger, J. and I.K. Schuller, "Magnetic Nanostructures: Overcoming thermal fluctuations," Nature Materials 2: 437-438 (Jul. 2003).

Fullerton, E.E. et al., "Antiferromagnetically coupled magnetic media layers for thermally stable high-density recording," Appl. Phys. Lett. 77(23): 3806-3808 (2000).

Gökemeijer, N.J. et al., "Memory effects of exchanging coupling in ferromagnet/antiferromagnet bilayers," Phys. Rev. B. 60(5): 3033-3036 (1999).

Judy, J.H., "Past, present, and future of perpendicular magnetic recording," Journal Magnetic and Magnetic Materials 235: 235-240 (2001).

Kappenberger, P. et al., "Direct imaging and determination of the uncompensated spin density in exchange-biased CoO/(CoPt) multilayers," Physical Review Letters 91(26): 267202-1-267202-4 (2003).

Kirk, T.L. et al., "Coercivity mechanisms in positive exchange-biased Co films and Co/PT multilayers," Phys. Rev. B 65: 224426-1-224426-5 (2002).

Kiwi, M., "Exchange bias theory," Journal of Magnetism and Magnetic Materials 234: 584-595 (2001).

Lange et al., "Phase diagram of a superconductor/ferromagnet bilayer," Phys. Rev. B. 68: 174522-1-174522-6 (2003).

Liu, K. et al., "Fabrication and thermal stability of arrays of Fe nanodots," Applied Physics Letters vol. 81, No. 2, pp. 4434-4436 Dec. 2, 2002.

Meiklejohn, W.H. and C.P. Bean, "New magnetic anisotrophy," Phys. Rev. 102(5): 1413-1414 (1956).

Miltényi, P. et al., "Tuning exchange bias," Appl. Phys. Lett. 75: 2304-2306 (1999).

Nogués, J. and I.K. Schuller, "Exchange Bias," Journal of Magnetism and Magnetic Materials 192: 203-232 (1999).

Nogués, J. et al., "Positive Exchange Bias in $FeF_2$-Fe Bilayers," Phys. Rev. Lett. 76(24): 4624-4627 (1996).

Nogués, J. et al., "Role of interfacial structure on exchange-biased $FeFe_2$-Fe," Phys. Rev. B 59(10): 6984-6993 (1999).

Nolting, F. et al., "Direct observation of the alignment of ferromagnetic spins by antiferromagnetic spins," Nature 405: 767-769 (2000).

Ohta, T. et al., "Opitcal recording; phase-change and magneto-optical recording," Journal of Magnetism and Magnetic Materials 242-245: 108-115 (2002).

Oppeneer, P.M., "Magneto-Optical Kerr Spectra," Chapter 2 in Handbook of Magnetic Materials, vol. 13 (Buschow, K.H. J., Editor), Elsevier, Amsterdam 2001, pp. 229-422.

Roshchin, I.V. et al., "Magnetic Nanodots: Exchange Bias, Vortex State, and Neutron Studies," American Physical Society, March Meeting 2004, Mar. 22-26, 2004, Palais des Congres de Montreal, Montreal, Quebec, Canada, Meeting ID: MAR04, abstract # H23.013 (Bulletin of the American Physical Society, vol. 49, 2004).

Roshcin, I.V. et al., "Lateral length scales in exchange bias," Europhysics Letters, vol. 71, No. 2, pp. 297-303 (2005).

Roy, S. et al., "In-Plan and Depth Dependent Magnetization in FeCr Multilayer," American Physical Society, March Meeting 2004, Mar. 22-26, 2004, Palais des Congres de Montreal, Montreal, Quebec, Canada, Meeting ID: MAR04, abstract # W27 14, Bulletin of the American Physical Society, vol. 49, p. 1334.

Schuller, I.K. et al., "Imprinting Domain Wall into Antiferromagnet," American Physical Society, March Meeting 2004, Mar. 22-26, 2004, Palais des Congres de Montreal, Montreal, Quebec, Canada, Meeting ID: MAR04, abstract #W27.009 (Bulletin of the American Physical Society, vol. 49, 2004).

Shi, H. and D. Lederman, "Exchange bias flop in $Fe_xZn_{1-x}F_2$/Co bilayers," Phys. Rev. B 66: 094426-1-094426-6 (2002).

Stamps, R.L., "Mechanisms for exchange bias," J. Phys. D: Appl. Phys. 33: R247-R268 (2000).

Wang, J.P., "Design of laminated antiferromagnetically coupled media for beyond 100 Gb/in$^2$ areal density," Journal of Applied Physics 91: 7694-7696 (2002).

Japanese Patent Office Action dated Nov. 19, 2008 for JP Patent Application No. 2007-521668, 5 pages.

English language translation of Japanese Office Action dated Nov. 19, 2008 for JP Patent Application No. 2007-521668, 7 pages.

Korean Intellectual Property Office, Office Action dated Jan. 30, 2008 for Korean Patent Application No. 10/2007-7003212, 5 pages.

English language translation of Korean Intellectual Property Office, Office Action dated Jan. 30, 2008 for Korean Patent Application No. 10/2007-7003212, 3 pages.

Korean Intellectual Property Office, Final Office Action dated Jan. 22, 2009 for Korean Patent Application No. 10/2007-7003212, 3 pages.

English language translation of Korean Intellectual Property Office, Final Office Action dated Jan. 22, 2009 for Korean Patent Application No. 10/2007-7003212, 3 pages.

* cited by examiner

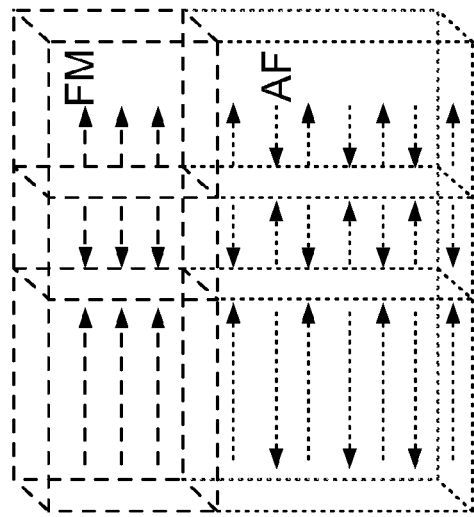
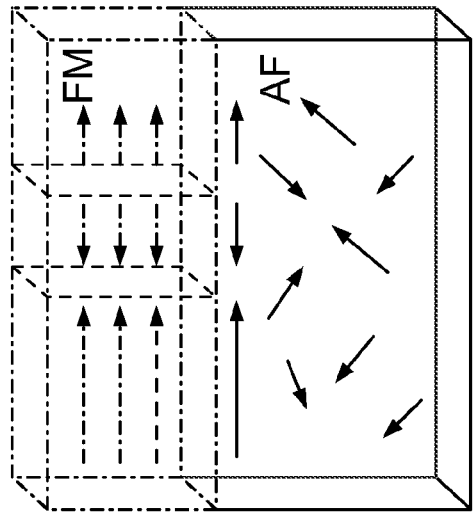
FIG. 6

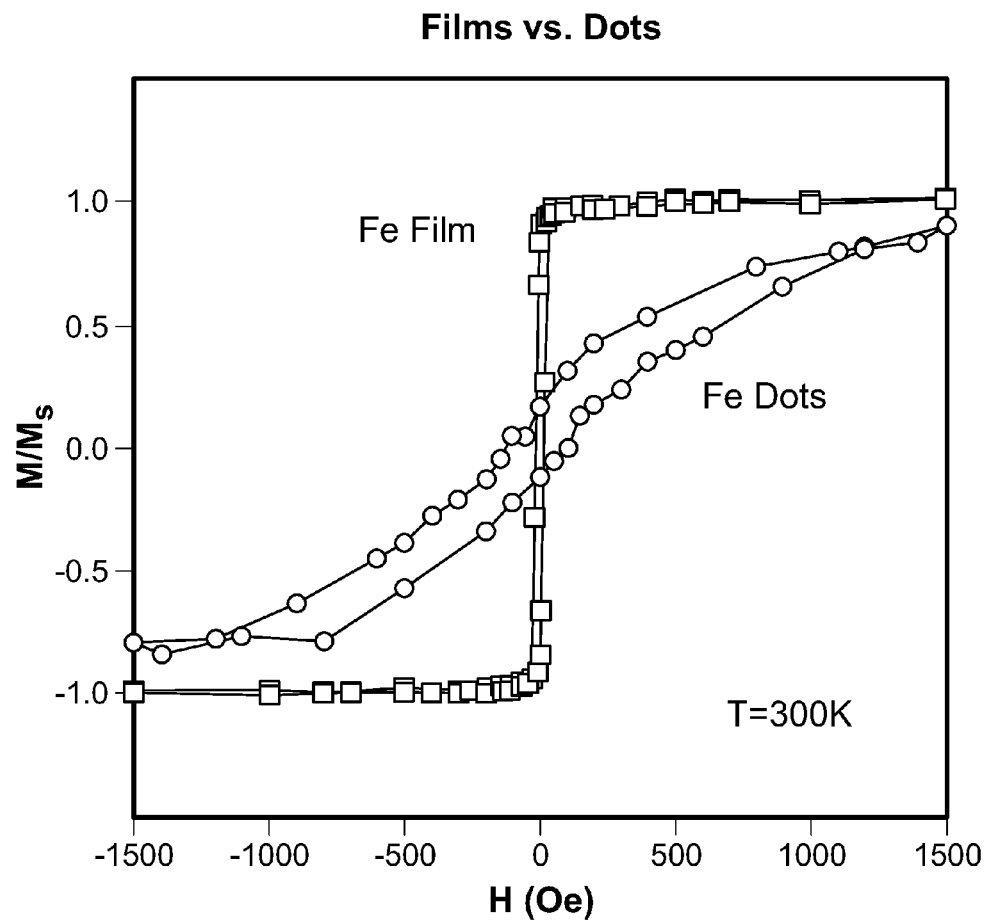
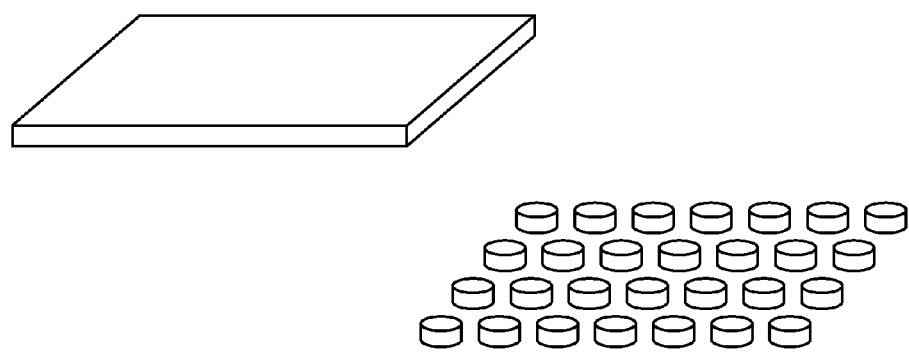
FIG. 9A

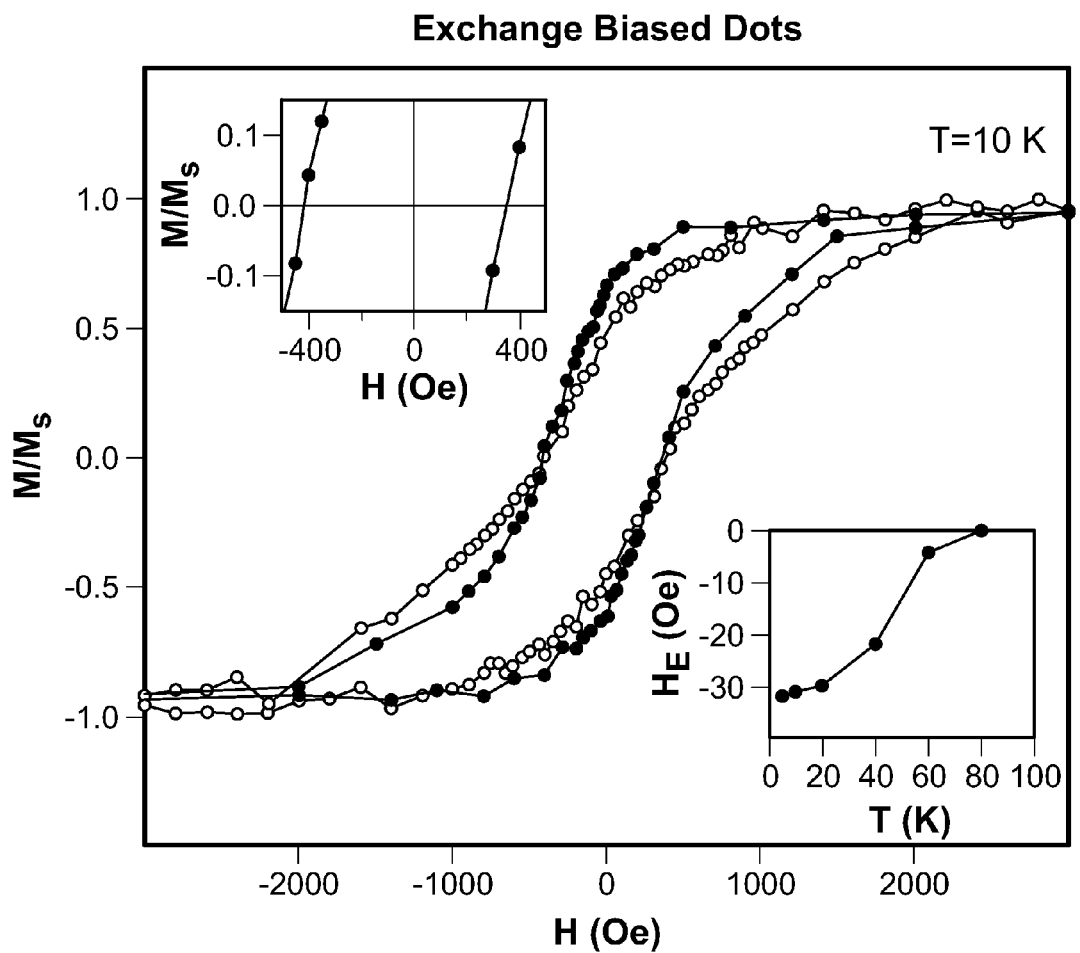
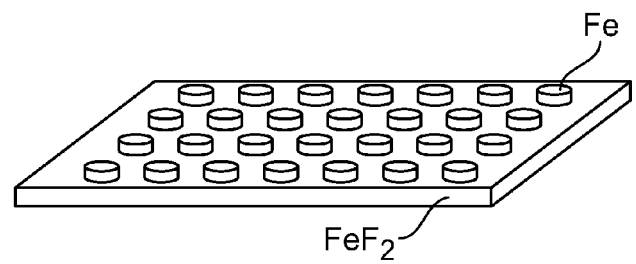
FIG. 9B

EXCHANGE-BIAS BASED MULTI-STATE MAGNETIC MEMORY AND LOGIC DEVICES AND MAGNETICALLY STABILIZED MAGNETIC STORAGE

This application claims the benefit of International Patent Application No. PCT/US2005/025129, filed Jul. 13, 2005, which further claims the benefit of U.S. Provisional Patent Application No. 60/587,789 entitled "EXCHANGE-BIAS BASED MULTI-STATE MAGNETIC MEMORY AND LOGIC DEVICES AND MAGNETICALLY STABILIZED MAGNETIC STORAGE" and filed Jul. 13, 2004. Both applications are incorporated herein by reference in their entirety.

STATEMENT REGARDING FEDERAL FUNDING

This invention was made in part with U.S. Government support under FA9550-04-1-0160 and DE-FG03-87ER-45332. The Government has certain rights in the invention.

BACKGROUND

This application relates to magnetic materials and magnetic storage media.

Magnetic materials may be used for data storage. Magnetic cards, tapes, disks, and hard drives are examples of storage devices made from various magnetic materials. In most commercial magnetic recording media, each recorded bit has two logic states "0" and "1" that are represented by two different magnetic states of the recording media. Two opposite directions of the magnetization of a magnetic domain in a magnetic material, for example, may be used for the binary states. In such a material, the density of stored information coincides with the density of the magnetic domains or "bits" carrying the information. Therefore, the size of the magnetic domains in such binary magnetic recording media dictates the storage density.

One approach to increasing the magnetic storage density is to reduce the magnetic domain size or the bit size. Many techniques may be used to achieve. For example, high-density recording materials with small domain sizes developed by Fujitsu and other companies have demonstrated storage densities at about 100 Gbit/sq. inch. A decrease in the magnetic bit size, however, may lead to a decrease in the thermal and magnetic stability of the magnetically stored information. Instability in magnetic media may be caused by various factors, including an increase in temperature and by presence of stray fields from the recording head when operating on the adjacent bits, and from the interaction with the adjacent bits.

SUMMARY

This application discloses techniques, materials, and devices to achieve high-density magnetic storage based on the magnetic exchange bias caused by magnetic coupling between a ferromagnetic layer and an adjacent antiferromagnetic layer. This magnetic coupling may be used to stabilize a binary magnetic memory device and to construct multi-state magnetic memory devices.

In one implementation, a method is described to stabilize a binary magnetic memory media. This method provides a magnetic storage material which comprises a ferromagnetic layer and an adjacent antiferromagnetic layer that are magnetically coupled to each other to provide a magnetic hysteresis loop as a binary magnetic storage medium. The ferromagnetic layer and the adjacent antiferromagnetic layer are configured to set the center of the magnetic hysteresis loop away from H=0 to stabilize each binary state against a stray magnetic field.

In another implementation, a device is described to include a magnetic storage material which comprises a ferromagnetic layer and an adjacent antiferromagnetic layer that are magnetically coupled to each other to store data at an operating temperature which is lower than a blocking temperature of the antiferromagnetic layer. The blocking temperature is lower than a Curie temperature of the ferromagnetic material. In one configuration of this device, the magnetic material is configured to have more than two magnetic states. In another configuration of this device, the ferromagnetic layer and the antiferromagnetic layer are selected to offset a magnetic hysteresis loop of the material away from a zero field to a magnetic field greater than a stray magnetic field in the device.

The above device may also include a temperature control mechanism to locally control a temperature of a selected magnetic domain and the material when data is written into the selected magnetic domain. The temperature control mechanism may be configured in various configurations. For example, it may include a laser and focuses a laser beam from the laser to a selected magnetic domain during writing, a conducting scanning probe microcopy (SPM) tip which heats up a selected magnetic domain, a resistive (ohmic) heating mechanism as part of each magnetic domain, or a resistive (ohmic) heating element which is in contact with the selected magnetic domain.

This application also describes a method for magnetic recording. A magnetic storage material is provided to include a ferromagnetic layer and an adjacent antiferromagnetic layer that are magnetically coupled to each other to store data at an operating temperature which is lower than a blocking temperature of the antiferromagnetic layer. The blocking temperature is lower than a Curie temperature of the ferromagnetic material. Localized heating is performed to raise temperature of a selected magnetic bit in the material above the blocking temperature. At the temperature above the blocking temperature, a magnetization process is applied to the selected magnetic bit set a remanent magnetization to a selected value of a pre-determined set of remanent magnetizations for the multi-state storage medium to write a bit. The external magnetic field at the selected magnetic bit is then removed and, at the zero field, the temperature of the selected magnetic bit is reduced below the blocking temperature to store the remanent magnetization in the selected bit.

This application further describes another method for magnetic recording. A magnetic storage material is provided to include a ferromagnetic layer and an adjacent antiferromagnetic layer that are magnetically coupled to each other to store data at an operating temperature which is lower than a blocking temperature of the antiferromagnetic layer. The blocking temperature is lower than a Curie temperature of the ferromagnetic material. Localized heating is performed to raise temperature of a selected magnetic bit in the material above the blocking temperature. At the temperature above the blocking temperature, a magnetization process is applied to the selected magnetic bit to set a remanent magnetization to a selected value of a pre-determined set of remanent magnetizations for the multi-state storage medium to write a bit. While maintaining a magnetic field of the magnetization process, the temperature of the selected magnetic bit is reduced below the blocking temperature to store the remanent magnetization in the selected bit.

These and other implementations, their application and variations are described in greater detail in the attached drawings, the detailed description, and the claims.

BRIEF DESCRIPTION OF DRAWINGS

FIG. 6 illustrates a domain structure frozen in the antiferromagnet upon cooling in a zero magnetic field in a preset remanent magnetization of the ferromagnet.

FIGS. 9A and 9B illustrate magnetic dots patterned from the ferromagnetic layer (e.g., Fe) on a continuous AF layer (e.g., $FeF_2$) in comparison with ferromagnetic only material (Fe only).

DETAILED DESCRIPTION

The magnetic materials, storage techniques and storage devices described in this application use two magnetically coupled magnetic layers, i.e., a ferromagnetic (F or FM) layer and an adjacent antiferromagnetic (AF or AFM) layer, to provide stabilized binary magnetic storage media and multi-state magnetic storage media. Stabilized binary magnetic storage media described here are tolerant to magnetic interference caused by various factors, including stray magnetic fields from the read/write head, adjacent magnetic bits, and other sources and hence can be used to achieve highly dense magnetic bits on the media. Multi-state magnetic storage media described here provide multiple remanent magnetization values to represent multiple states in each magnetic bit to increase the information content stored in each bit.

Figure 1:
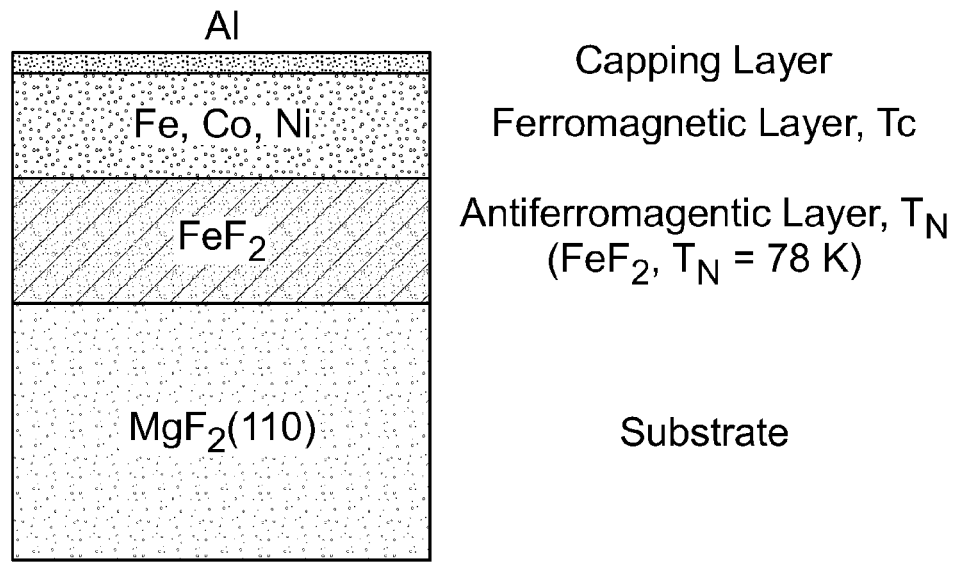
FIG. 1 shows an example of a ferromagnetic-antiferromagnetic coupled medium.

FIG. 1 shows one example of a magnetic medium having coupled ferromagnetic layer and antiferromagnetic layers. As illustrated, an AF layer such as $FeF_2$ and a F layer such as Fe, Co, Ni or other F metals or metal alloys are formed on a substrate $MgF_2$ (110). In this example, the AF layer is directly deposited on the substrate. In other implementations, one or more seed layers may be formed between the substrate and the AF layer when the material for the AF layer and the substrate are very different (e.g., lattice structures). The AF layer may be made of an AF material that is either a single crystal material (single crystalline) or a polycrystalline material. The grain size of the polycrystalline material should be grater than the size of each magnetic domain that defines a bit. An optional capping layer such as an aluminum layer may be formed top of the F-AF layer to protect the magnetic medium and the choice of the capping layer material may depend on the choice of the F material. Such as a capping layer does not participate directly in the process of recording. Data is magnetically written into the F-AF coupled media in form of a particular remanent magnetization at a temperature above the blocking temperature of AF layer. The temperature is then reduced below the blocking temperature so that the written magnetic state, either a binary state or a state of multiple states, is imprinted in the bit without being affected by any magnetic field present during the normal operation of the magnetic memory including the fields from the read/write head and adjacent bits. Subsequent readout operations are then performed at the reduced temperature below the blocking temperature of the AF layer. The blocking temperature is the temperature below which the bilayer F-AF system exhibits exchange bias. Exchange bias is usually observed as a horizontal shift of the magnetization curve (hysteresis loop) and usually accompanied by enhancement in coercive field of the system. The blocking temperature is equal or small to the transition temperature of the AF, Neel temperature. The F-AF coupled media in this application can be designed so that the Curie temperature of the F layer is higher than the blocking temperature of the AF layer and the AF material for the AF layer selected so its blocking temperature is higher than the upper limit (e.g., 80° C. or higher) of the operating temperatures for such devices. As such, the temperature of the medium is usually below the blocking temperature and can be raised above the blocking temperature by heating for writing data. Hence, magnetic devices using the F-AF bits include, among others, a magnetic read/write head and a temperature control mechanism.

Figure 2:
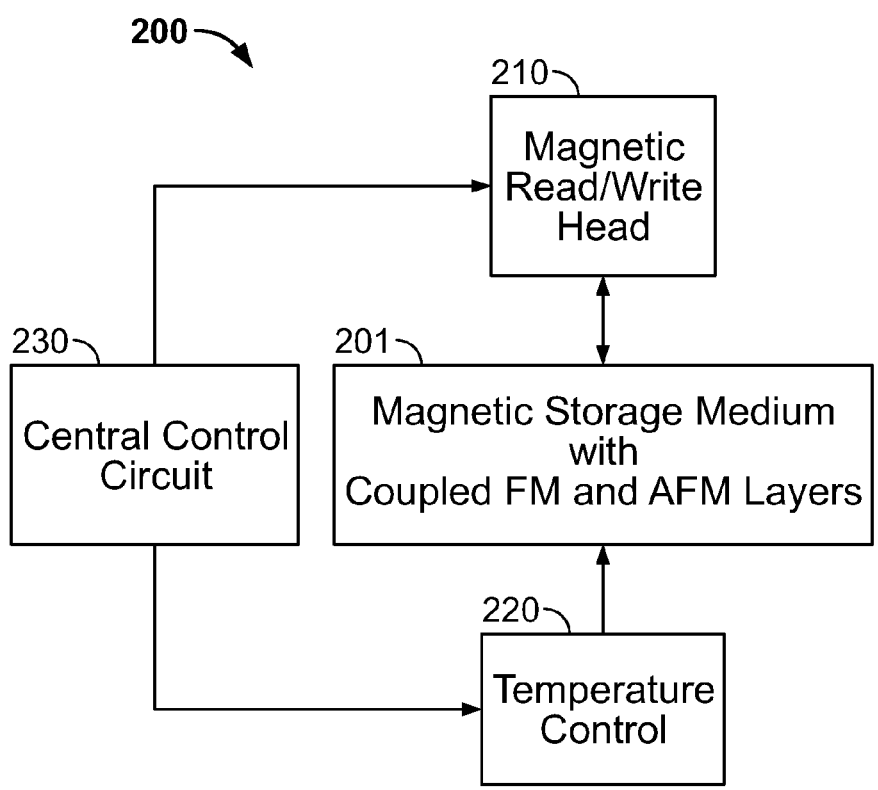
FIG. 2 is an example of a magnetic storage device using ferromagnetic-antiferromagnetic coupled media.

FIG. 2 shows an example of a magnetic memory device 200 for F-AF coupled media under either the stabilized binary configuration or the multi-state configuration. A medium holding mechanism is provided to hold a storage medium 201 with coupled F and AF layers. As an example, if the device 200 is a disk drive, the medium holding mechanism may include a cartridge for holding the disk and a motorized spindle to rotate the disk. A read/write head 210 and a head actuator engaged to the head 210 may be used to control and place the head 210 over the medium 201. A temperature control 220 is provided to control the temperature of the F-AF medium 201. The temperature control 220 may be designed to supply heat to a selected bit locally to raise its temperature above the blocking temperature. The heating is localized to the selected bit only, without significantly raising the local temperature of adjacent bits above the blocking temperature. Under this design, each magnetic domain or bit of the medium can be individually heated for writing new data.

The local heating may be implemented in various configurations. For example, the temperature control 220 may use a laser to direct a focused laser beam to a selected bit on the medium 201 for the local heating. The focusing of the laser beam may be achieved by using near-field optics such as a solid immersion lens. In another example, electrical resistive (ohmic) heating may be used to control the heating and the temperature of each individual bit position in the F-AF media. The resistive heating may be implemented as part of the F-AF media to heat each bit itself by running a heating current at each bit position. Alternatively, a separate resistive heating element may be used to be in contact with the area of the bit, e.g. at the intersection of the bit/word lines like in the writing of a bit in a CMOS-type memory. In yet another example, a conducting scanning probe microcopy (SPM) tip can be used to direct a current to a selected bit for local heating. Notably, the thermal control 220 may be integrated as part of the read/write head 210 so that a single positioning mechanism can be used to control the positioning of the local heating and the magnetic head.

The F-AF materials described in this application may also be used to construct MRAM without any moving parts. Such MRAM includes a temperature control to individually control the temperature at each bit position of the MRAM.

The following sections first describe materials designs and properties of F-AF coupled media based on exchange bias. Next, domain stabilization for binary F-AF media and multistate F-AF media are described.

Properties of Ferromagnetic-Antiferromagnetic Coupled Media

Exchange bias due to magnetic coupling of F and AF layers causes a change in the magnetic anisotropy in both F and AF layers. One theoretical model for explaining the exchange bias is the lateral length scale model. See, Igor Roshschin et al. in "Lateral length scales in exchange bias," Europhysics Letters published on line at http:/www.edpsciences.org/epl on Jun. 17, 2005, and is scheduled to appear in Vol. 71 (July 2005), the entire disclosure of which is incorporated by reference as part of the specification of this application. Other explanations are possible. Experimental findings explaining the local regime of exchange bias are used here to simply aid the understanding of the exchange bias behind the stabilization techniques and multi-state memory techniques and should be construed to limit various implementations described in this application.

When a ferromagnet is in proximity to an antiferromagnet, lateral length scales such as the respective magnetic domain sizes can drastically affect the exchange bias. Bilayers of $FeF_2$ and either Ni, Co or Fe are studied using SQUID and spatially resolved MOKE. When the antiferromagnetic domains are larger than or comparable to the ferromagnetic domains, a local, non-averaging exchange bias is observed. This gives rise to unusual and tunable magnetic hysteresis curves.

When two dissimilar materials are in contact, the proximity effect is often observed, where one material modifies the properties of the other. Because of the finite extent of electron wave functions, the proximity effect is typically described as the spatial variation of an order parameter across the interface. For example, the proximity effect that occurs in superconductor-normal bilayers is characterized by the decay of the superconducting order parameter into the normal material with a length scale referred to as the coherence length. Interestingly, no correlation between characteristic length scales of physical quantities changing in the plane parallel to the interface has ever been claimed to play a role in the proximity effect.

The relation between the lateral characteristic length scales on the two sides of the interface is important for exchange bias. Exchange bias (EB) is a proximity effect between a ferromagnet (F) and an antiferromagnet (AF) in intimate contact with each other [1]. Usually, EB is described as an additional unidirectional anisotropy induced by the AF into the F via exchange coupling at the interface. This produces a single magnetic hysteresis loop shifted along the magnetic field axis, below the AF ordering (Néel) temperature, $T_N$. The magnitude of this shift is defined as the exchange bias field, $H_e$, and can be positive or negative. Unlike AF affecting F, less obvious and usually more difficult to observe is the effect of the F on the properties of the AF [2]. Both the F and AF can form magnetic domains, which leads to spatial variation of the magnetization in the F and the staggered magnetization in the AF in the plane parallel to the interface. Due to the mutual influence between the F and AF, the interfacial spin configuration may deviate significantly from that of the bulk AF and F. In this report, the AF domains in the exchange-biased systems refer to the area that induces the same unidirectional anisotropy.

When the AF domains are larger than or comparable to the F domains, local, non-averaging EB is observed [3]. Such a sample can split magnetically into two subsystems with the $H_e$ of the same magnitude but opposite sign. This state is achieved either by zero-field cooling a partially demagnetized sample or by cooling the sample in a properly chosen constant applied magnetic field. In either case, the two magnetic subsystems behave independently of each other, and no averaging of EB occurs. This manifests itself clearly as a double hysteresis loop. In addition, the local EB sign can be manipulated by either creating domains in the F during the demagnetization process or by varying the field-cooling procedure [4]. These results reveal new physics of heterogeneous magnetic structures and proximity effects with inhomogeneous order parameters.

Typically, a 38-100 nm thick layer of $FeF_2$ is grown on a (110) $MgF_2$ substrate at 300° C., followed by a 4-70 nm thick ferromagnetic layer (Co, Fe or Ni) grown at 150° C., coated in situ with a 3-4 nm layer of Al to prevent the magnetic layers from oxidation [5]. The $FeF_2$ antiferromagnet ($T_N$=78.4 K) grows epitaxially and untwinned in the (110) orientation on a (110) $MgF_2$ substrate [6] as determined by X-ray diffraction. Based on the bulk structure, the ideal surface of (110) $FeF_2$ is assumed to have compensated spins, oriented in-plane with the easy axis along the [001] direction [5]. X-ray diffraction measurements show that the ferromagnetic layer for all samples is polycrystalline. A uniaxial magnetic anisotropy present in all samples, with the easy axis along the $FeF_2$ easy axis, even at temperatures much higher than $T_N$ is attributed to a growth-induced anisotropy. The ferromagnetic transition temperature of all three ferromagnets is well above room temperature. The in-plane sample magnetization parallel to the applied field is measured using a dc SQUID magnetometer and magneto-optical Kerr effect (MOKE). The direction of the sample magnetization during cool down is defined as positive; the sign of the hysteresis loop shift defines the EB sign. The magnetic moment vs. applied magnetic field curves for all samples show a typical ferromagnetic behavior above $T_N$: a single hysteresis loop, symmetric with respect to the origin.

In the first series of experiments, the sample is demagnetized at 300 K to a chosen value of the remanent magnetization along the easy axis, $M_R$, between 0 and $M_S$, the saturation magnetization. This leads to the formation of F domains with the magnetizations in opposite directions along the easy axis. The balance between the magnetization of the two types of domains determines the resultant magnetization of the sample. After the sample is cooled in zero magnetic field (ZFC) below $T_N$, the low-field magnetic moment is measured as a function of applied magnetic field at various temperatures. The sample cooled from full remanent magnetization, $M_R \approx M_S$, shows single hysteresis loops exchange-biased to negative fields by $H_e(T)$ (FIG. 3A). In contrast, the sample cooled with a reduced remanent magnetization shows double hysteresis loops (e.g., FIG. 3A for $M_R\approx 0.5\, M_S$ and $M_R\approx 0$). Each loop is shifted along the magnetic field axis by the same absolute value of temperature-dependent $H_e(T)$, but in the opposite directions. The loop height ratio is set by the remanent state, in which the sample was cooled, and it is equal to the magnetization ratio of the two types of domains in that state. Thus, the system "remembers" the remanent magnetization state above $T_N$.

Figure 3:
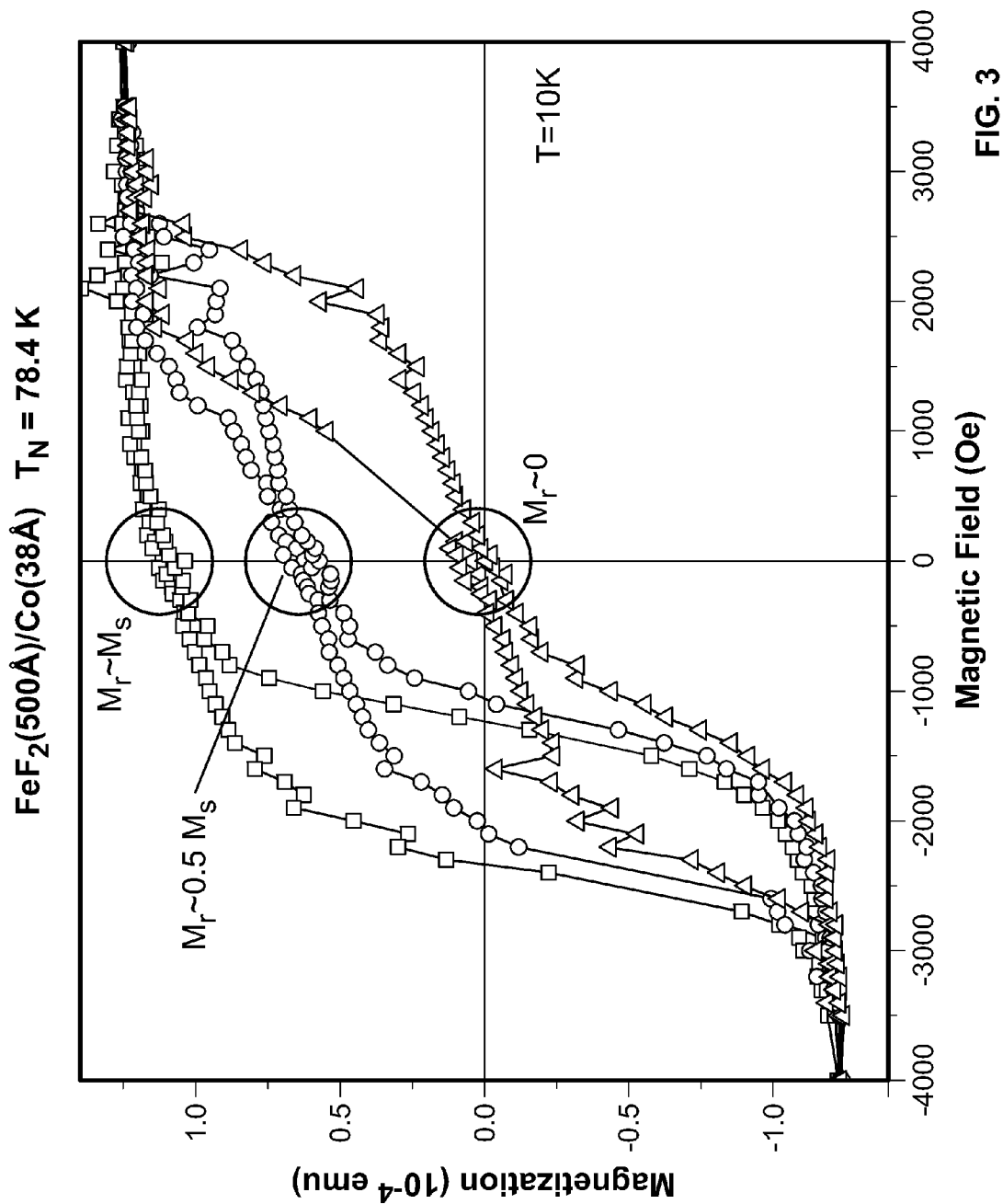
FIGS. 3 and 4 show various measurements of ferromagnetic-antiferromagnetic coupled media.

In the second series of experiments, the same sample is first magnetized at T=150 K by applying the magnetic field along the easy axis, above the irreversibility field of the hysteresis curve. Then the sample is cooled in an applied field (FC), $H_{FC}$ (FIG. 3). For small $H_{FC}$, the magnetization curves below $T_N$ consist of a single hysteresis loop, shifted by negative He(T). For large $H_{FC}$, the magnetization curves below $T_N$ also exhibit a single hysteresis loop, but shifted to positive fields by virtually the same absolute value of $H_e T$). For intermediate $H_{FC}$, the magnetization curves below $T_N$ consist of two hysteresis loops, one shifted to negative and the other to the same positive fields $H_e(T)$, as in the first series of experiments. The characteristic cooling field ranges depend on the material and the thickness of both F and AF. For example, for the $FeF_2$(38 nm)/Co(4 nm) sample (FIG. 3), the double loops are observed for cooling fields between 0.1 kOe and 30 kOe.

Figure 4:
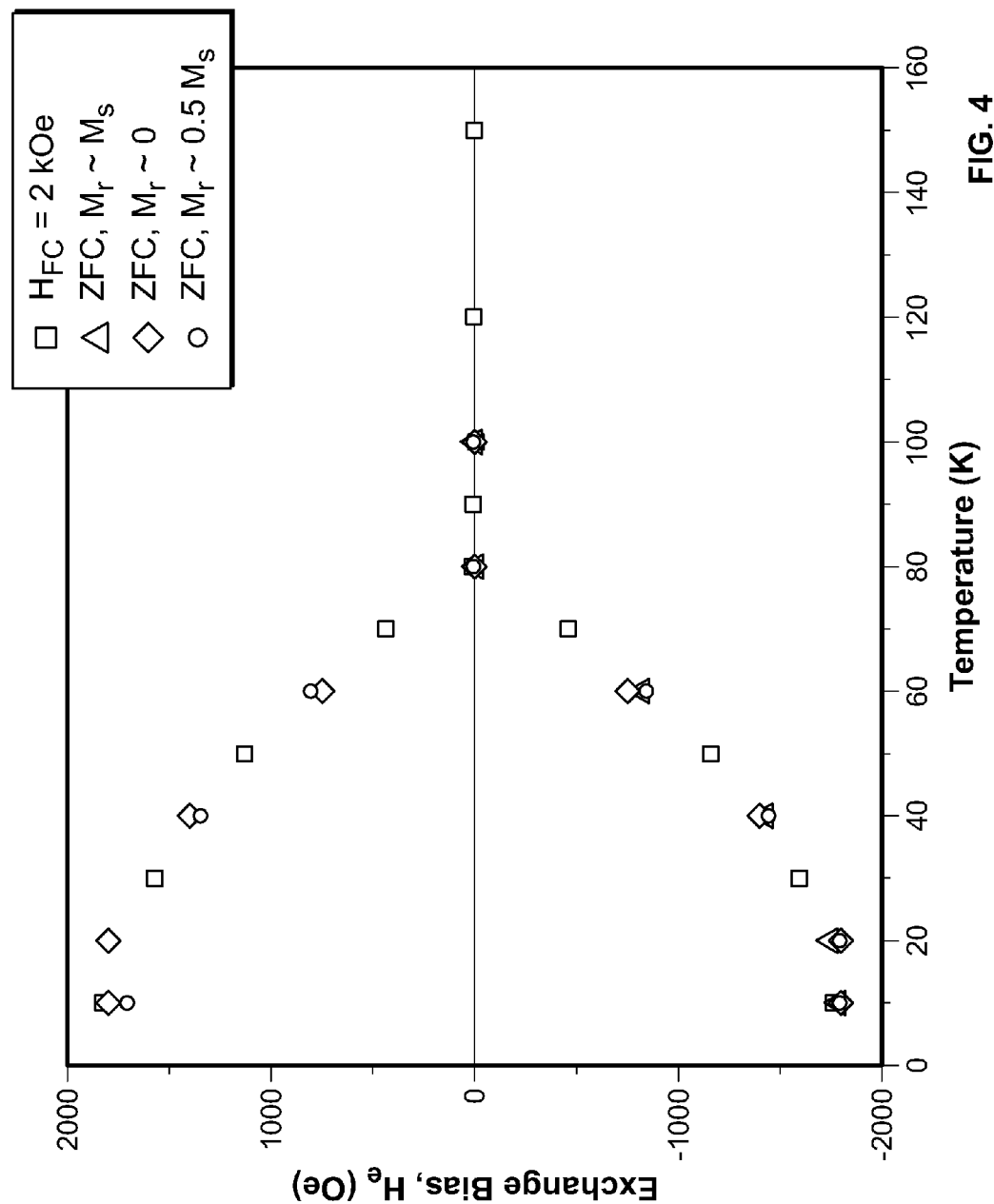

It is remarkable that in both experimental series, positive and negative $H_e(T)$ of equal absolute value are found at all temperatures below $T_N$ (FIG. 4). At any particular temperature, the width of both loops is equal to that of the single hysteresis loop (twice the coercive field, $2H_c$). When rescaled vertically, both the single loops and each of the double loops have exactly the same shape and temperature evolution. Thus, two types of independent regions are formed with identical properties, one positively and the other negatively exchange-biased.

In these samples, the loop half-width is smaller than its shift, i.e. $H_c<H_e$. The condition $H_c\leqq H_e$ is essential for clear observation of the double hysteresis loops. In contrast, the results presented in [7,8] were in the opposite limit: $H_c>>H_e$, thus the double loops could not be resolved.

Figure 5A:
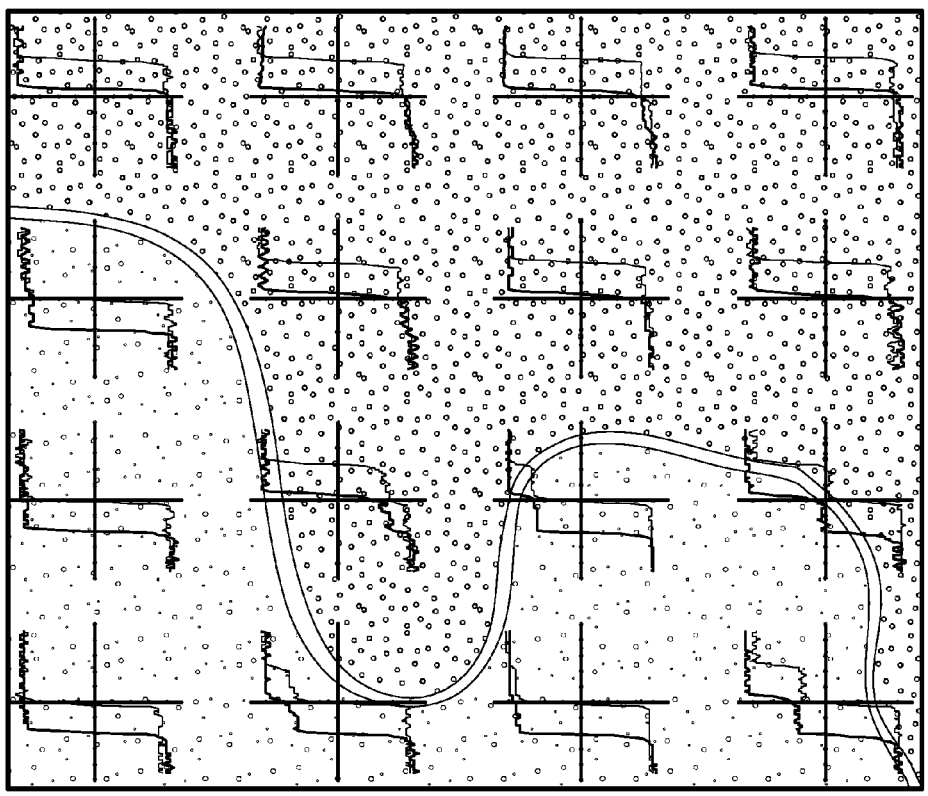
FIGS. 5A and 5B. Magnetic hysteresis loops along the easy axis with magneto-optical Kerr effect MOKE on a 5 mm×5 mm $FeF_2$(70 nm)/Ni(70 nm)/Al(4 nm) sample at different parts of the sample as indicated on the figure, with a ~500 μm laser spot. The measurement is done below the transition temperature of $FeF_2$ after the sample is cooled in a zero magnetic field from the demagnetized state with $M_R \approx 0$. The background color in a) represents the local direction of the exchange bias: red—negative, blue—positive.
Figure 5B:
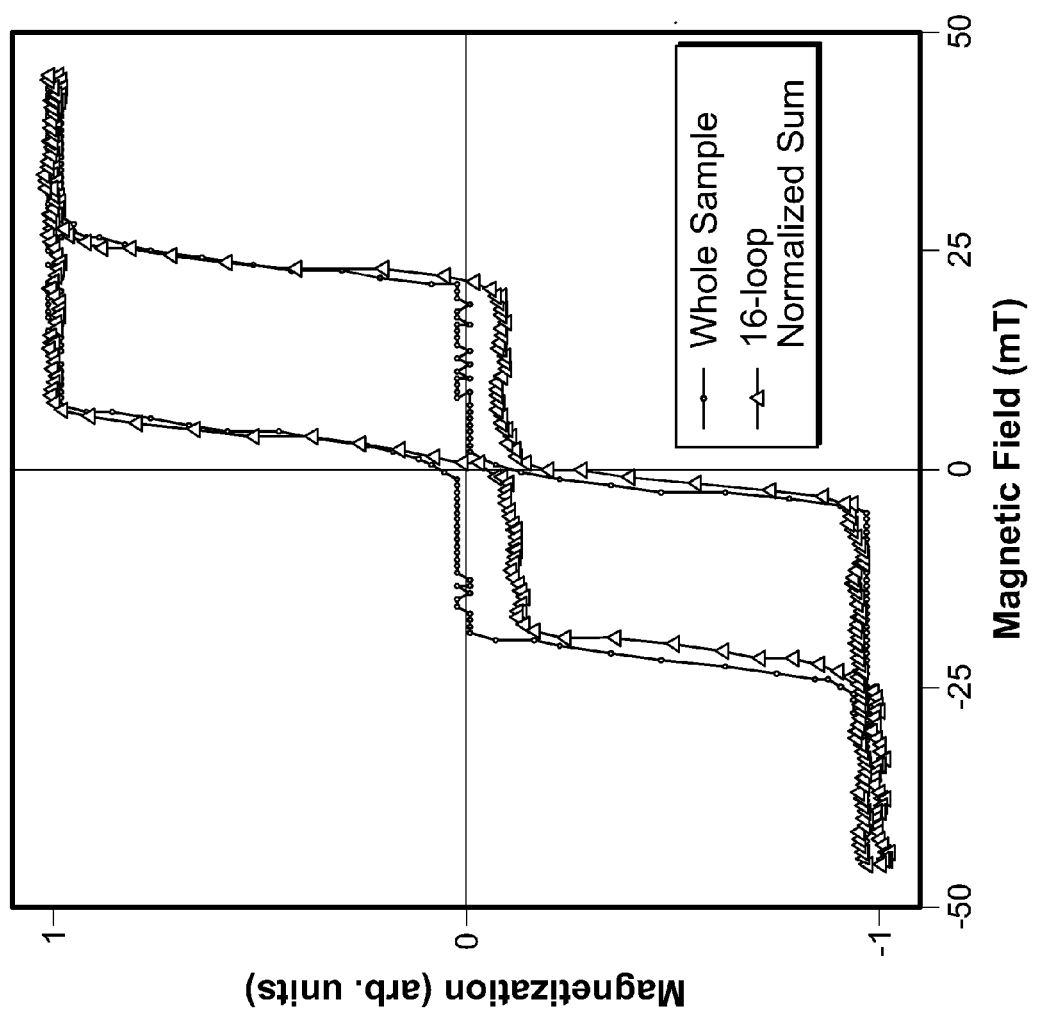

The conclusions of the first two series of experiments are unambiguously confirmed by spatially resolved MOKE, measured as intensity difference of the reflected p-polarized light [9]. FIGS. 5A and 5B show the relevant measurements.

For this experiment, a 5 mm×5 mm $FeF_2$ (70 nm)/Ni(70 nm)/Al (4 nm) sample is demagnetized above $T_N$ and then cooled below $T_N$ in a zero applied magnetic field as is done in the first series of the experiments. First, the MOKE signal (generally considered [9] to be proportional to the magnetization) as a function of applied magnetic field is collected from the entire sample surface area, illuminated with a wide beam. The curve consists of a double hysteresis loop (FIG. 5B). Without any change in the experimental conditions, MOKE measurements are performed using a ~500 μm diameter laser beam at 16 spots arranged in a 4×4 matrix, in the positions shown in FIG. 5A. The resultant signal (FIG. 5A), which is proportional to the magnetization, varies spatially: on one side of the sample the single loop is negatively shifted, on the other side—the single loop is positively shifted, and in between—double hysteresis loops are found. The normalized sum of these 16 curves (green triangles in FIG. 5B) is in good agreement with the hysteresis curve obtained from the entire sample (black circles). The slight difference between the two curves is due to incomplete coverage of the surface area by the 16 measured spots. No spatial variation is observed when the sample is ZFC from the full remanent magnetization.

This experiment confirms that the sample has two types of areas; single hysteresis loops are shifted by the same $H_e$, positively in one area, and negatively in the other. When the laser beam covers parts of both areas, the magnetization curve consists of two loops shifted in opposite directions, with their relative heights determined by the ratio of the two areas.

These experimental results lead to two main findings. First, the sample can split into two independent subsystems with opposite sign of the EB. This can be achieved either by cooling a partially or completely demagnetized sample in zero applied magnetic field, or by cooling the sample in a judiciously chosen intermediate applied magnetic field. The appropriate field range is determined by sample parameters: materials, layer thickness, interface roughness, etc. Second, the exchange bias for each F domain is not averaged over various AF domains, so double hysteresis loops are observed.

The phenomenon of EB has attracted much attention; several mechanisms of EB have been proposed of which many neglect variations of EB on the scale of F domains. The dependence of $H_c$ and $H_e$ on the AF and/or F domain sizes in patterned F-AF bilayers, or in diluted AF has been studied. Enhancement of $H_e$ in the AF-F bilayers with patterned F layer was explained by suppression of F-F exchange interaction in the small F domains. Correspondence of AF domains to the F domains, and small spatial variations of the value of EB were reported. Double hysteresis loops and a correlation of domain structure in the F and the AF were observed in CoO/NiFe samples zero-field-cooled from a demagnetized state and explained using the exchange spring model [20, 21]. Exchange bias field and the shape of the double hysteresis loops in $FeF_2$/Fe [22] and $Fe_{0.6}Zn_{0.4}F_2$/Fe [23] bilayers were found to depend on the remanent magnetization during cooling in a zero applied magnetic field. Double and negatively shifted single hysteresis loops were observed in FeMn/FeMnC samples [24] deposited in various small magnetic fields (0-40 Oe) without any clear trend. In zero-field deposited NiFe/NiFeMn samples, spatial variation of MOKE signal measured along the hard axis was claimed [25], but no supporting plot was presented.

The large number of reported experiments performed on different samples, show seemingly contradictory and unconnected results. Combined with multiple interpretations, this leads to a complex and confusing situation where no conclusion can be made. It is obvious that only a comprehensive study with several different experiments on the same sample can provide definite answers on the role of the relative sizes of the AF and F domains in EB.

In EB, we find two distinct regimes depending on the relation between the AF and F domain sizes. First, when the AF domains are smaller than the F domains, a F domain averages the direction and magnitude of $H_e$ over several AF domains. This may lead to a continuous variation of $H_e$ as a function of the cooling field and single hysteresis loops, as found in twinned $FeF_2$/Fe [26] and $MnF_2$/Fe [27] samples. If the AF domains are very small, the number of the AF domains interacting with each F domain is very large. In this case, each F domain can be essentially treated as a separate sample. When ZFC the sample, the sign for the net EB for each of these domains is set by the direction of the magnetization of the F domain, so double loops may occasionally be observed [20-22]. X-ray reflectivity measurements [6] imply that the in-plane structural coherence in the twinned (110) $FeF_2$ grown on (100) MgO is 6-10 nm with the easy axes of the crystallites at 90° to each other. Such spatial variation of the easy axis, combined with the small size of the grain establishes the maximum size of AF domains, resulting in the averaging regime of EB.

When the AF domain size is comparable to or larger than the F domain size, each F domain couples only to one AF domain with a particular direction of the EB, so no averaging occurs. This results in the same absolute value of the $H_e$ for different cooling fields and double hysteresis loops, as reported in this work. In this regime, when the sample is zero-fieldcooled, the unidirectional anisotropy in the AF is set locally through the antiferromagnetic coupling [26] between the interfacial F and AF moments. Therefore, the local sign of the EB for each F domain is determined by the direction of the magnetization of that domain during sample cooling. Thus, domains of the F with opposite magnetization direction above $T_N$ have the same magnitude but opposite sign of EB below $T_N$.

When the sample is field-cooled, also, only the sign, but not the magnitude of $H_e$ depends on the cooling field, $H_{FC}$. It is the sign of the projection of $H_{total}$ on the easy axis, $H_{total}$, that determines the sign of the local EB. $H_{total}$, the total local cooling field sensed by the interfacial spins of the AF, is the sum of the applied magnetic field, $H_{FC}$, and the local exchange field due to the interfacial F moments, $H_F$. Spatial inhomogeneity of the sample leads to inhomogeneity of $H_F$, which in turn leads to inhomogeneity of $H_{total}$. At intermediate $H_{FC}$, this causes the magnitude of $H_{total}$ to be small and spatially inhomogeneous, giving rise to areas of the interface with positive and negative sign of $H_{total}$. Consequently, cooling the sample below $T_N$ in this field leads to the negative and the positive EB, respectively. According to X-ray reflectivity measurements [6] the in-plane structural coherence in the untwinned (110) $FeF_2$ grown on a (110) MgF2 single crystal substrate is ~28 nm. Moreover, due to absence of twinning, the size of AF domains can be much larger than the grain size, unlike in the case of a twinned $FeF_2$. Large, mm-size AF domains have been observed in bulk single-crystal fluorides [28]. In the ZFC case, the AF and F domains are observed to be comparable in size and larger than the laser beam. Simulations confirm that the relative domain sizes determine the splitting of the sample into two magnetic subsystems and the regime of EB (to be published elsewhere).

The relevance of the observation presented here to other systems was illustrated in a multilayer system imitating an AF-F system [29]. For the sample with the larger domains in the layer playing the role of interfacial AF spins, double hysteresis loops were observed for intermediate cooling fields. It is not clear whether such a model system correctly mimics the domain structure in real AF-F systems. Those results, however, provide an additional experimental configuration in which relative domain sizes play a role.

Hence, the relative AF and F domain sizes affect ex-change bias. When the AF domain size is larger than or comparable to that in the F, structural or magnetic inhomogeneities can result in the sample splitting into two independent subsystems upon cooling through the AF transition temperature, $T_N$. Each subsystem exhibits EB of the same magnitude but of the opposite sign. This results in magnetization curves with double hysteresis loops, thus unambiguously showing non-averaging, local EB. This behavior is reproducibly observed in samples with three different F: Ni, Fe, and Co, with various F and AF layer thicknesses. These observations also show that not only the properties of the F but those of the AF are modified in EB. We suggest that relative lateral length scales may be relevant in other proximity effects with spatially inhomogeneous order parameters, such as a granular superconductor (S) in proximity to a normal metal, or a S in proximity to a F that has domains [30].

The present magnetic storage materials and devices based on magnetic coupling between a ferromagnetic (F) layer and an adjacent antiferromagnetic (AF) layer use the remanent magnetization in the F layer to imprint the AF layer. This AF-F coupling produces exchange bias. FIG. 6 illustrates the setting of the unidirectional anisotropy of the AF (interfacial spins of the AF) by a zero field cooling from a state with a particular value of the remanent magnetization in the F layer. This imprinting is used to write the data in each bit. One of the results of the exchange bias is a horizontal shift of M(H) magnetization curve by the value called as exchange bias field, He. Large exchange bias can be achieved in both continuous multilayers and multilayers patterned into nanostructures.

Magnetically Stabilized Binary Recording Media

The above domain imprinting allows controlling locally the direction of the additional unidirectional anisotropy induced into the F from the AF. This additional unidirectional anisotropy enhances the magnetic stability of the F bit or F nanostructure by increasing the effective energy barrier for magnetic switching.

Figure 7B:
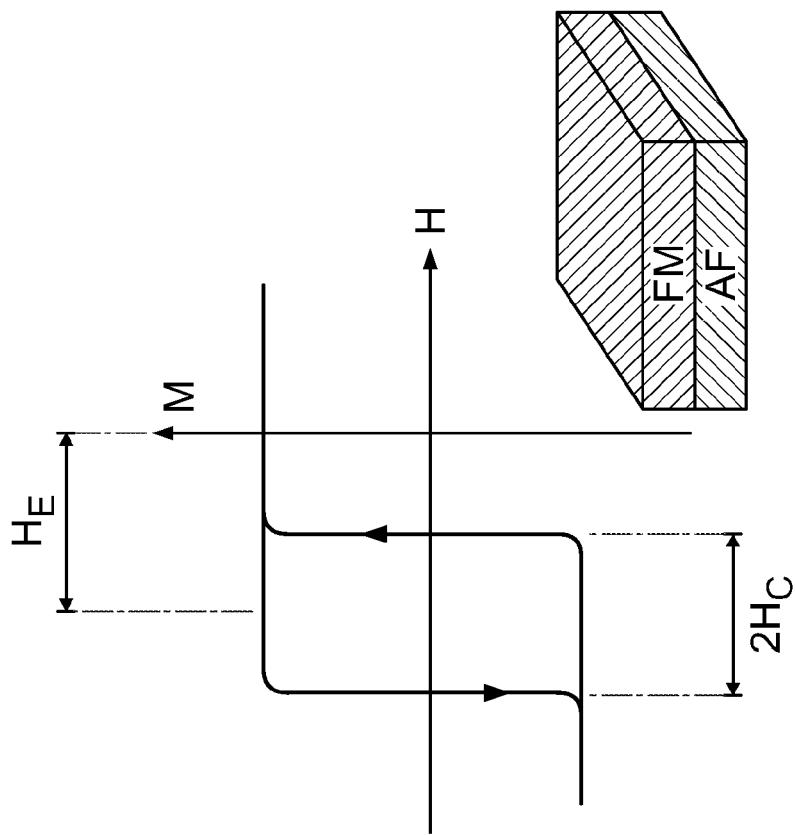
FIGS. 7A and 7B illustrate the shift and change in the hysteresis loop of a ferromagnetic-antiferromagnetic coupled medium in comparison with a ferromagnetic medium.
Figure 7A:
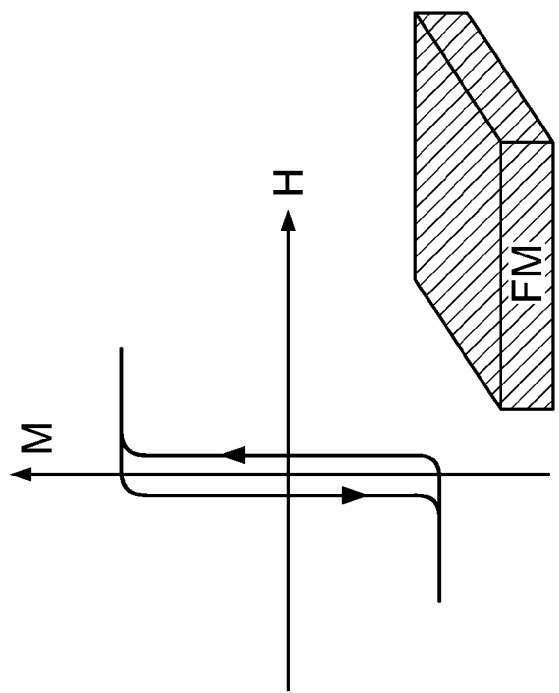

FIG. 7A shows the magnetic hysteresis loop of an exemplary ferromagnetic material used in many conventional binary magnetic storage devices. The two logic states are represented by the maximum magnetizations in two opposite directions (positive and negative). The loop is centered at H=0. Hence, any stray field with a field strength similar to or greater than the coercive field $H_c$ of the ferromagnetic material can cause the bit to change its magnetic state and hence erase the stored information. A new material based on F-AF coupling, however, shifts the center of the hysteresis loop away from H=0 by $H_E$ to either the positive or negative side of H=0. FIG. 7B illustrates this shift. As a result, a stray field with the magnitude smaller than $|H_E|+|Hc|$ can no longer affect the magnetic state of the material even if the magnitude of the stray field is similar to or greater than Hc. As such, the new material based on F-AF coupling is stabilized with respect to various stray fields. In addition, the exchange bias between the F and AF layers further increase the coercive field $H_c$ or the width of the hysteresis loop of the new material, this further enhances the stability of the stored bit against stray fields.

Hence, the present use of the F-AF coupling in magnetic media allows smaller bit size and alleviates certain limitations in the ferromagnetic storage media. As mentioned above, the ferromagnetic storage medium is adversely affected by the stray field produced by the recording head operating on the adjacent bit due to the danger of partial or full erasure of the stored information. The design of F-AF coupled media to shift the hysteresis loop and to increase the coercive field of the media can significantly reduce the adverse effects of the stray fields. As another example, the present technique can also remove or lessen the restriction on the operating temperature range due to the danger of partial or full erasure of the stored information by thermal fluctuations of the magnetic moments within the magnetic bit. The present magnetic stabilization may be used in magnetic recording such as high-density and high-stability hard disk drives, magnetic tapes, magnetic RAM, and other magnetic memory and logic devices.

The present stabilization technique may be used in magnetic recording devices and magnetic recording media for both in-plane and perpendicular magnetic recording to stabilize the information stored in patterned or unpatterned magnetic media and to increase the recording density and reach the range of 100s Gbit/sq. inch and 1 Tbit/sq. inch densities and higher. In addition, the present stabilization techniques may be used to increase the density of information on magnetic recording tapes and to increase the density and stability of recorded information in Magnetic Random Access Memory (MRAM). Furthermore, the present stabilization techniques may also be used in other magnetic recording applications for similar purposes.

Figure 8:
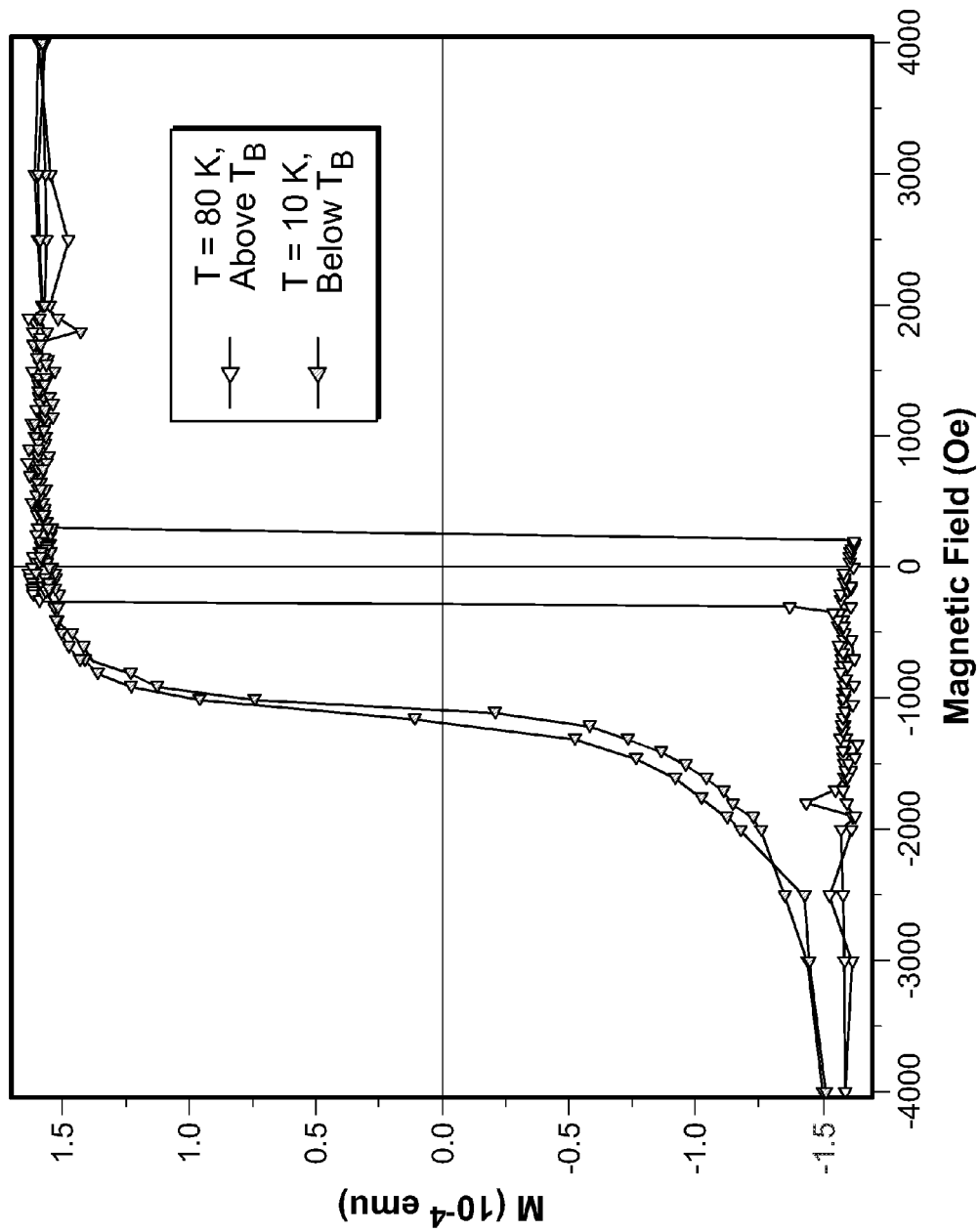
FIG. 8 shows easy axis magnetic hysteresis curves above and below $T_B$ for a $MgF_2/FeF_2$/Ni sample which was cooled in 2 kOe field, where the uniaxial anisotropy induced by the antiferromagnet into the ferromagnet is shown.

The described stabilization techniques may be applied to magnetic recording media having thin film multilayers that include a ferromagnet and either an antiferromagnet, or a so-called synthetic antiferromagnet (SAF), which is hereafter included into the AF category. In the bit recording process, the recording head heats up locally the bit containing the F and AF layers, above the AF blocking temperature, $T_B$. In case of Magnetic RAM type of memory, heating can be done resistively, using Ohmic heat. The F layer magnetization of the bit is switched by applying a local magnetic field produced by the recording head in a fashion similar to the existing, or any proposed in the future technology. The heating is then switched off, and the bit is cooled below $T_B$, so that the unidirectional anisotropy of the AF layer that gets induced into the F, is set. FIG. 8 shows the measured loop along the easy axis of a MgF2/FeF2/Ni sample under a cooling process in an applied field of 2 kOe where the uniaxial anisotropy induced by the F layer is imprinted into the AF layer.

After that the magnetic field can be turned off. As an alternative for the process, the magnetic field can be turned off before cooling the sample to achieve the same result as demonstrated in FIG. 8. This design and procedure increase the energy barrier required for bit switching, and protects the bit from being erased due to thermal fluctuations or in the process of recording adjacent bits. Local heating is done by any method, e.g. using a laser, near-field optics, conducting scanning probe tip or resistive (Ohmic) heating of the bit itself or the element in contact with the area of the bit, using, e.g. design with a combination of the bit/word lines like writing a bit in CMOS-type memory.

The readout can be done employing existing, or future magnetic information readout technology. The read head senses the stray magnetic fields due to the magnetic moment of the F layer of the bit. Due to exchange bias with the AF layer, the magnetic hysteresis loop of such bit is shifted to positive or negative fields. If the loop is negatively shifted, the remanent magnetization is positive, and vice-versa. This defines "0" and "1" state. AF materials need to have $T_B > 80°$ C. This includes, but is not limited to: NiO, IrMn, and FeMn.

The F-AF coupled media may also be patterned to separate different magnetic bits from one another to further improve the stability and the tolerance to stray fields. FIGS. 9A and 9B illustrate magnetic dots patterned from the ferromagnetic layer (e.g., Fe) on a continuous AF layer (e.g., $FeF_2$) in comparison with ferromagnetic only material (Fe only).

Figures 10A, 10B:
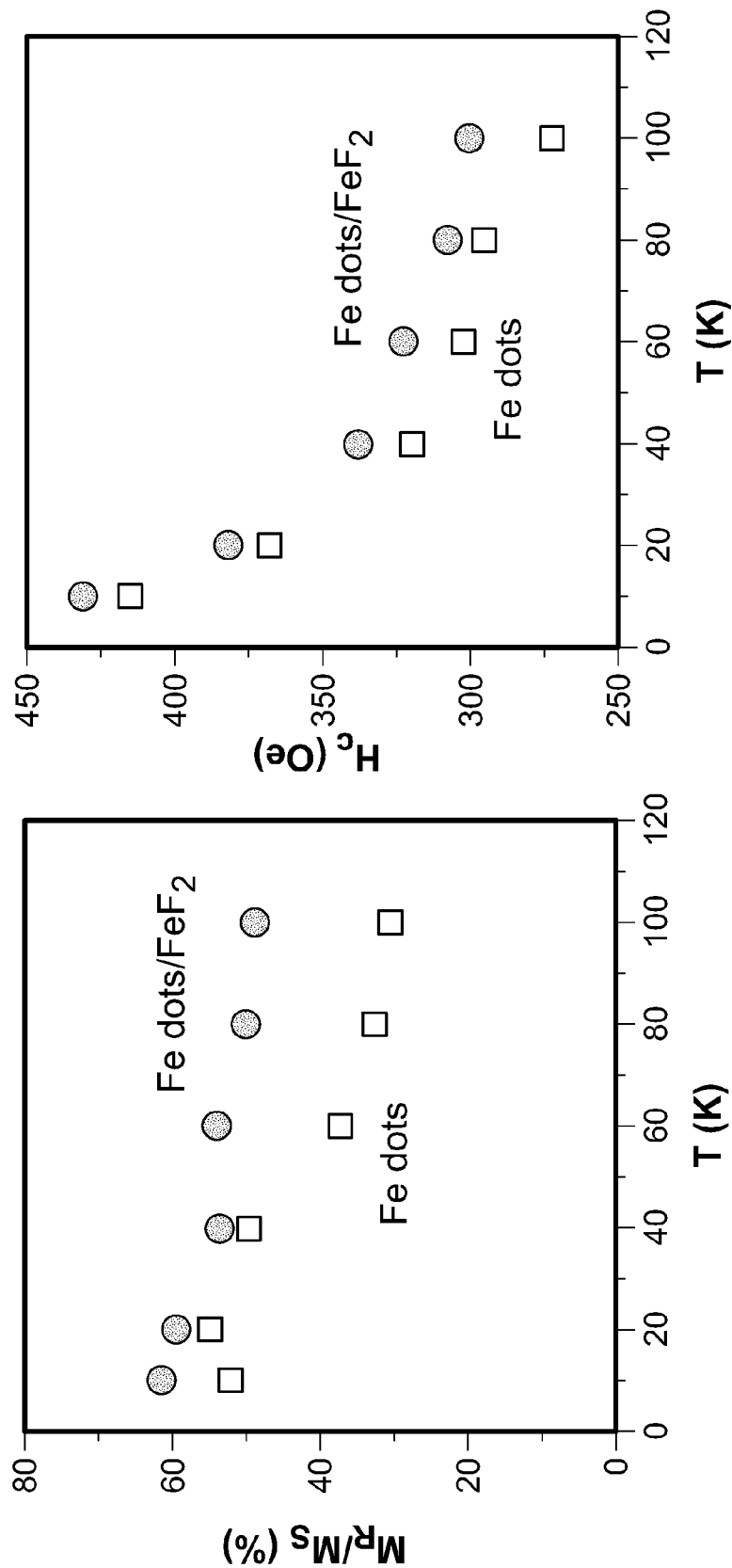
FIGS. 10A and 10B further show measured stabilization data for Fe only dot medium and $Fe/FeF_2$ dot medium.

FIGS. 10A and 10B further show measured stabilization data for Fe only dot medium and $Fe/FeF_2$ dot medium.

Magnetic Storage with Multiple States from AF-F Coupling

The above imprinting from the F layer to the AF layer can be used to locally set the direction of the exchange bias to either positive or negative. Therefore, a bi-domain magnetic state can be created where the two domains have opposite directions of the exchange bias. The ratio of the sizes of the two domains determines the remanent magnetization of the magnetic area which is used as a magnetic "bit" for data storage. This use of two domains at one bit location allows creating a magnetic memory with multi-state magnetic "bits," which are well-defined and stable in a wide range of magnetic fields. The states correspond to the values of the remanent magnetization, $M_r$, between the positive and negative values of the saturated magnetization Ms such that $M_{ri}=M_s i/n$, where 2n+1 is the total number of states, and i can take any values between −n and +n. The maximum number of the multi states is set by the magnetic sensing limit of the device.

Figure 11:
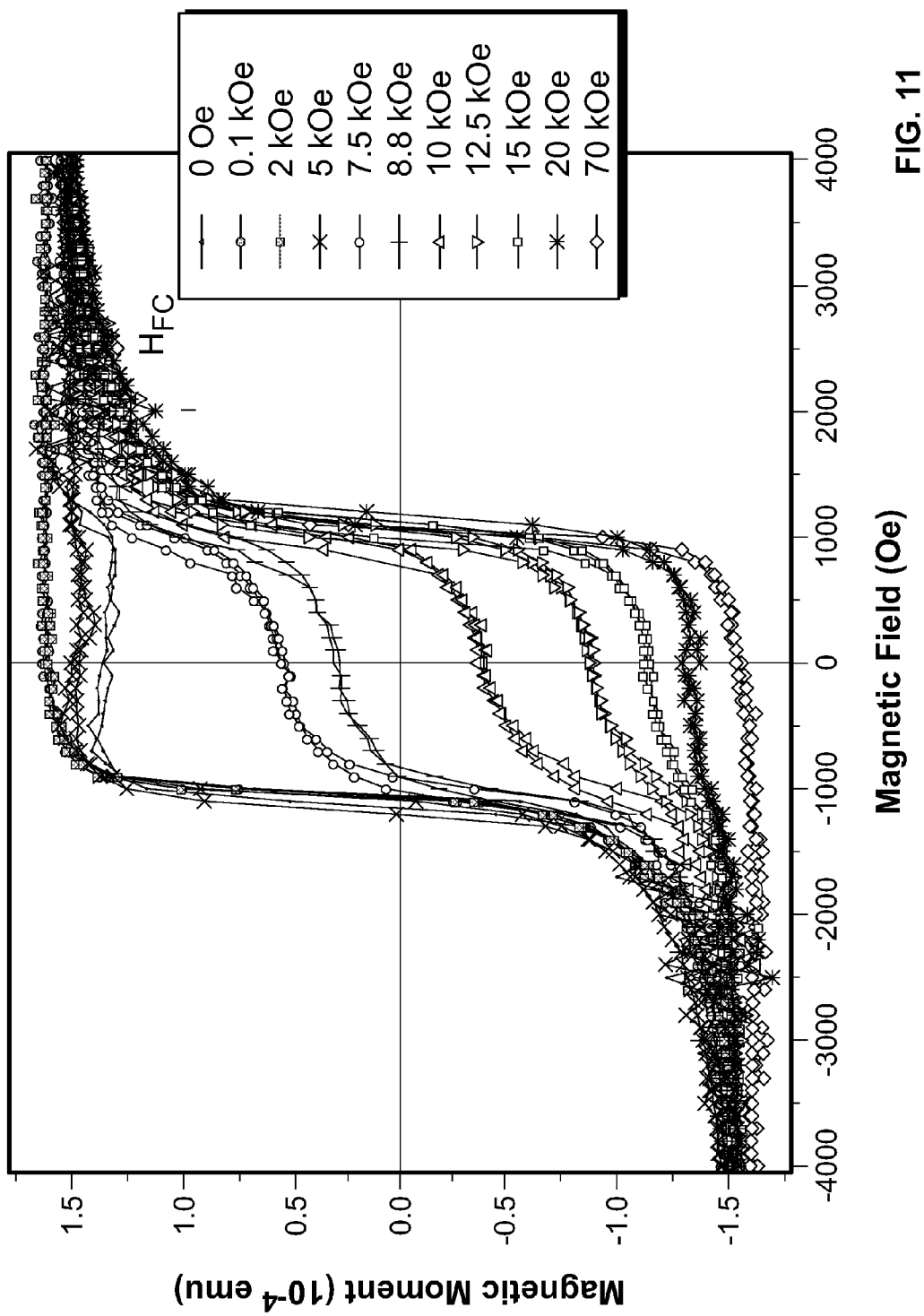
FIG. 11. Easy axis magnetic hysteresis curves for a $MgF_2/FeF_2$/Ni/Al sample cooled in the specified magnetic field. The remanent magnetization depends on the cooling field, and is fixed at that value after the sample is cooled below $T_N$ of $FeF_2$.
Figure 12:
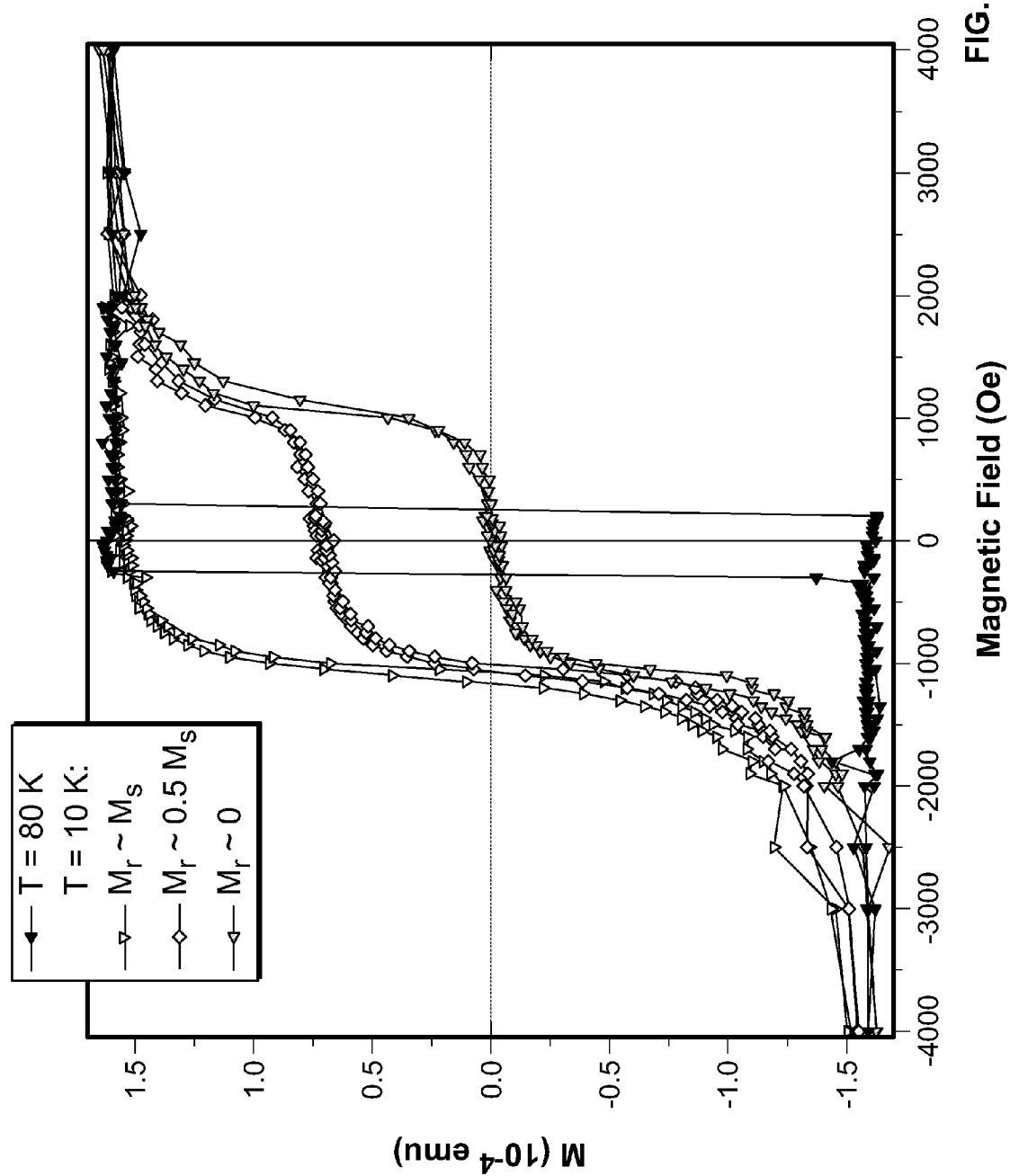
FIG. 12. Easy axis magnetic hysteresis curves measured below $T_N$ (at T=10 K) for a $MgF_2/FeF_2$/Ni sample, zero field cooled from various remanent magnetization states. The remanent magnetization, set by partial demagnetization above $T_N$ of $FeF_2$, is preserved after the sample is cooled below $T_N$. The black curve shows the hysteresis curve above the $T_N$ (T=80 K)

FIGS. 11 and 12 show examples of setting the remanent magnetization of the F layer in a F-AF medium to different values by cooling in various magnetic fields, or by zero field cooling in a chosen remanent magnetization state from above to below the Neel temperature $T_N$ that in this case coincides with the blocking temperature.

In such multistate storage devices, the readout procedure of such multi-state "bits" can be done by various methods, including magneto-optical or magneto-resistive methods. The multi-state magnetic materials may be used in multi-state magnetic recording devices and magnetic recording media for both in-plane and perpendicular magnetic recording, and in multi-state logic elements. Among a number of the advantages, such materials may be used to increase the magnetic memory density by recording information in a multi-state magnetic "bit" that stores more than one bit of information. Multi-state magnetic logic elements and devices can be created based on the above multi-state bits.

In various implementations, such materials may be used to form thin film multilayers that include a ferromagnet and an antiferromagnet, or a so-called synthetic antiferromagnet (SAF), hereafter included into the category "AF." The ratio of the sizes of the two domains determines the remanent magnetization of the magnetic area as a magnetic "bit"). The exact value of remanent magnetization can be set and controlled by various magnetization processes.

Figure 13:
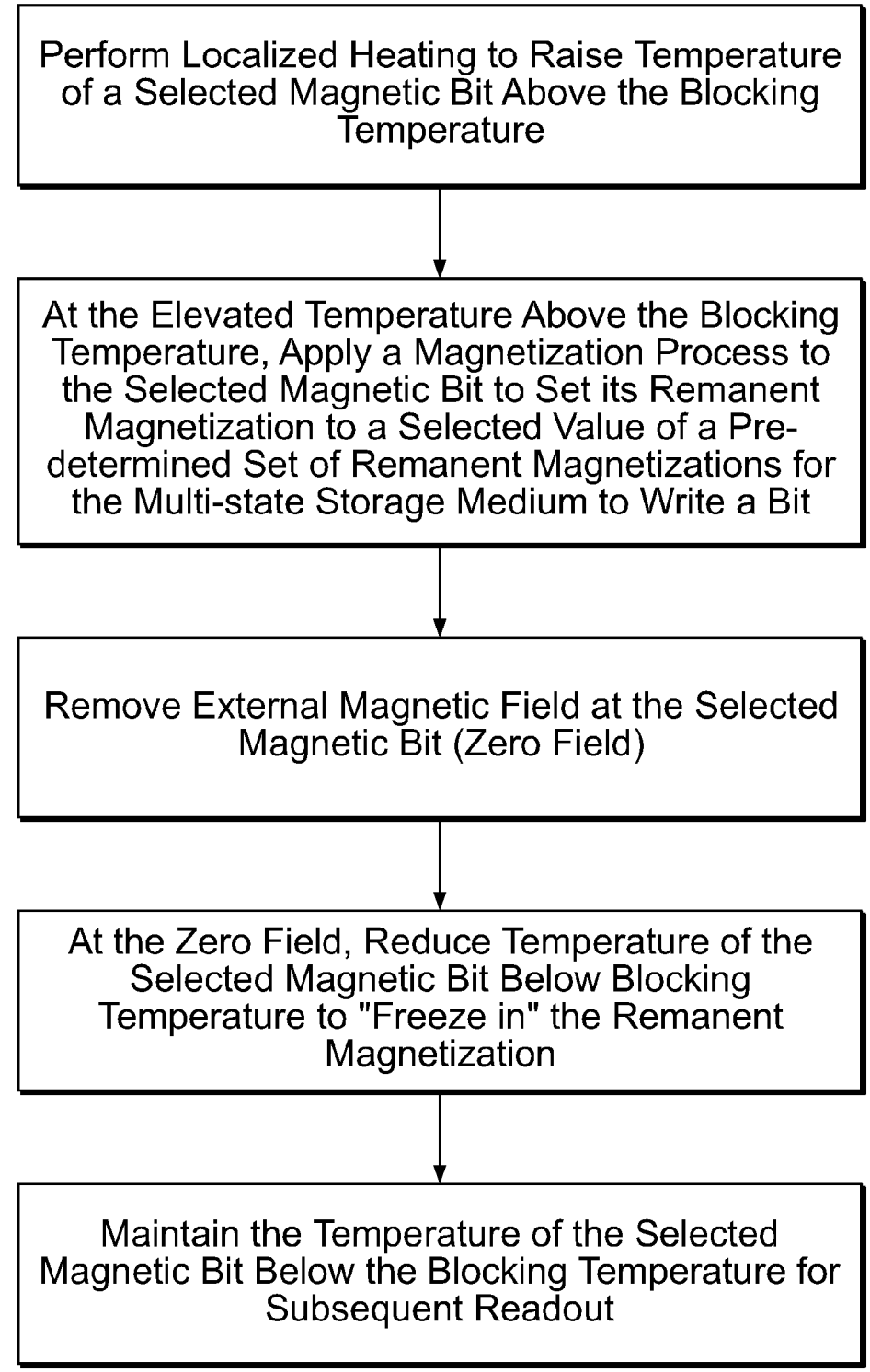
FIGS. 13 and 14 illustrate two different writing methods for writing data in multistate storage media.
Figure 14:
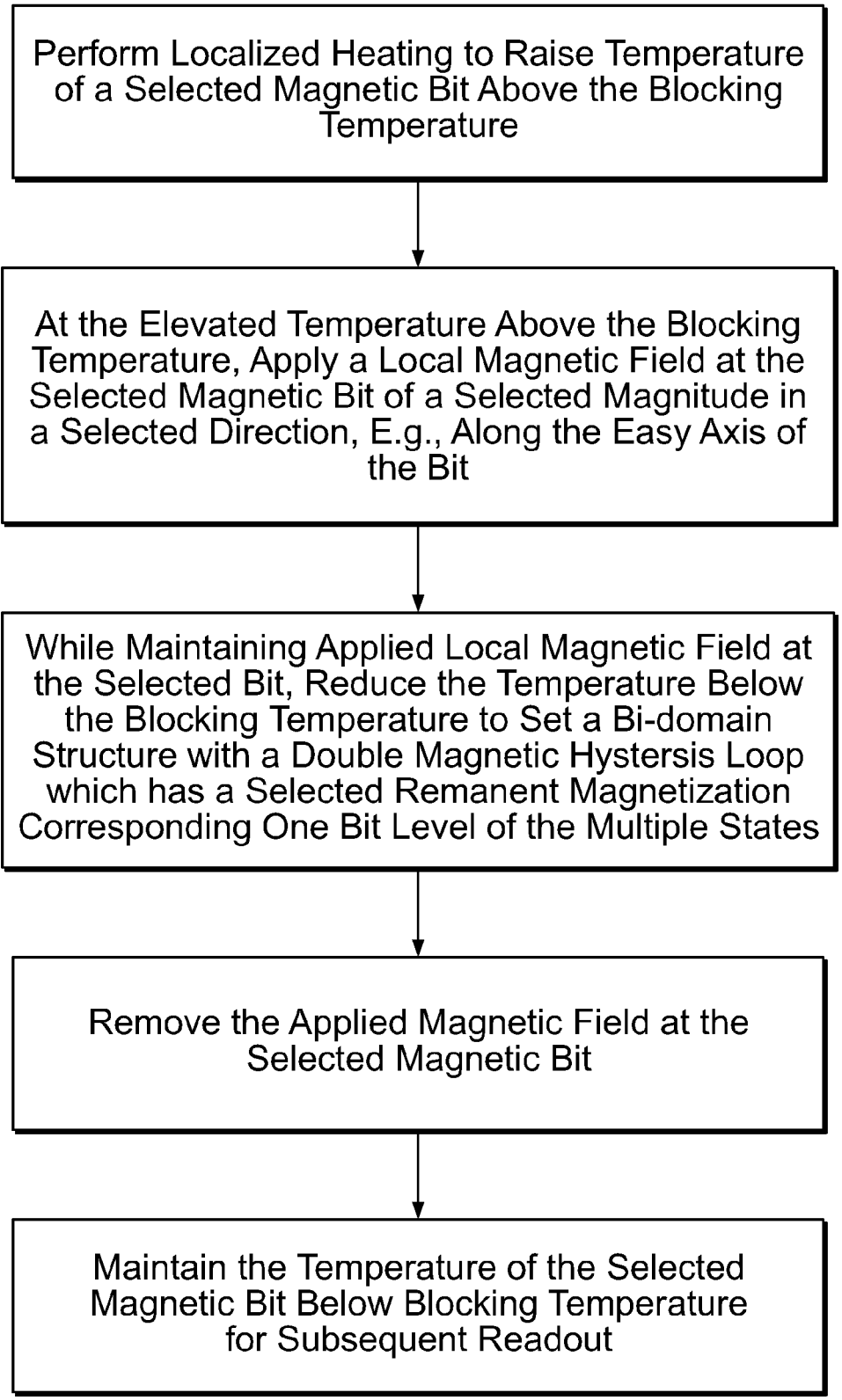

Various writing methods may be used to produce the desired remanent magnetization levels in each bit. Two examples are described below. FIG. 13 illustrates the first writing method where the cooling is performed without an external field. More specifically, the following steps are performed in this method.

1. The chosen magnetic bit is heated above its blocking temperature, $T_B$, i.e. the temperature at which the exchange bias direction is set.

2. The chosen remanent magnetization, $M_{r0}$ is achieved by following a minor loop. One of the possible procedures is to saturate the magnetization of the magnetic bit by applying a large enough magnetic field in a direction opposite to the direction of $M_{r0}$, and then apply a smaller magnetic field in the direction of $M_{r0}$ of such a magnitude to produce the remanent magnetization to be equal to $M_{r0}$ upon removal of the applied magnetic field. Then the magnetic field is removed.

3. The bit is cooled below $T_B$ in absence of an applied magnetic field.

4. The remanent magnetization value is imprinted in this AF-F bit, and is not affected by either the magnetic field used for writing adjacent magnetic bits, nor by the stray fields from the adjacent magnetic bits, as long as the particular bit is kept below $T_B$.

A second writing process is described below where an external field is applied during the cooling process:

1. The chosen magnetic bit is heated above its blocking temperature, $T_B$, i.e. the temperature at which the exchange bias direction is set.

2. The magnetic field of a particular magnitude is applied.

3. Then the bit is cooled below $T_B$ in the applied magnetic field.

4. Cooling the bit in a magnetic field of a particular magnitude allows to set a bi-domain structure that has a double magnetic hysteresis loop with a chosen value of the remanent magnetization. The remanent magnetization value is imprinted in this AF-F bit, and is not affected by the magnetic field used for writing adjacent magnetic bits, as well as the stray fields from the adjacent magnetic bits, as long as the particular bit is kept below $T_B$.

The recorded signal can be set to correspond to any chosen remanent magnetization of the bit in the range between −Ms and Ms that is very stable in a wide field range. Local heating can be performed by any method, e.g. using a laser, near-field optics, conducting scanning probe microcopy (SPM) tip or resistive (Ohmic) heating of the bit itself or the element in contact with the area of the bit, using, e.g. design with a combination of the bit/word lines like writing a bit in CMOS-type memory. AF materials need to have $T_B$>80° C. to be useful for applications. Examples of suitable AF materials include, but are not limited to, NiO, IrMn, and FeMn. The readout procedure of this multi-state "bits" can be done by various methods, including magneto-optical or magneto-resistive methods. One of the possible scenarios is to measure the magneto-optical Kerr effect (MOKE) signal that is proportional to the value of the remanent magnetization, which corresponds to the recorded state.

Such multi-state bits may be used as a basis for a new generation of multi-state logic elements and devices. In this case, as an alternative to the laser heating, resistive heating can be used in the writing procedure described above. The readout can be either magneto-optical or magnetoresistive. An example for the possible magnetoresistive readout could be a magnetoresistive sensor on top of the magnetic "bit." The value of the resistance of that sensor should uniquely correspond (be proportional) to the value of the local magnetic field, similarly to the technique used in the GMR read-heads.

Applications of such and other materials include magnetic recording such as high density and high stability hard disk drives, magnetic tapes, Magnetic RAM, other magnetic recording devices, and multi-state logic devices and elements of logic circuits. Other applications are also possible.

Only a few examples and applications are described. Other variations and enhancements may be made.

What is claimed is what is described and illustrated, including:

1. A device comprising:
   a magnetic storage material which comprises a ferromagnetic layer and an adjacent antiferromagnetic layer that are magnetically coupled to each other to store data in the ferromagnetic layer at an operating temperature which is lower than a blocking temperature of the antiferromagnetic layer,
   wherein the blocking temperature is lower than a Curie temperature of the ferromagnetic material,
   wherein the ferromagnetic layer and the antiferromagnetic layer are selected to offset a magnetic hysteresis loop of the magnetic storage material away from a zero field to a magnetic field greater than a stray magnetic field in the device; and
   a control mechanism to locally control a temperature and a magnetic field in a region of a selected magnetic domain and the magnetic storage material when data is written into the selected magnetic domain.

2. The device as in claim 1, wherein a first portion of the control mechanism is configured to control the magnetic field and comprises:
   a magnetic or magneto-optical head to read from and write to the magnetic storage material.

3. The device as in claim 1, wherein a second portion of the control mechanism is configured to control the temperature and comprises a laser and focuses a laser beam from the laser to a selected magnetic domain during writing.

4. The device as in claim 3, wherein the second portion of the control mechanism further comprises near-field optics to focus the laser beam.

5. The device as in claim 1, wherein a second portion of the control mechanism is configured to control the temperature and comprises a conducting scanning probe microcopy (SPM) tip which heats up a selected magnetic domain.

6. The device as in claim 1, wherein a second portion of the control mechanism is configured to control the temperature and comprises a resistive (ohmic) heating mechanism as part of each magnetic domain.

7. The device as in claim 1, wherein a second portion of the control mechanism is configured to control the temperature and includes a resistive (ohmic) heating element which is in contact with the selected magnetic domain.

8. The device as in claim 1, wherein a first portion of the control mechanism is configured to control the magnetic field and comprises:
   array of wire lines disposed so that two or more of the array of wire lines intersect in the region of the selected magnetic domain, wherein the array of wires is operated to read from and write to the magnetic storage material.

9. A device comprising:
   a magnetic storage material which comprises a ferromagnetic layer and an adjacent antiferromagnetic layer that are magnetically coupled to each other to store data at an operating temperature which is lower than a blocking temperature of the antiferromagnetic layer,
   wherein the blocking temperature is lower than a Curie temperature of the ferromagnetic material,
   wherein each of magnetic bits in the magnetic storage material is configured to have two or more domains of opposite directions of an exchange bias to constitute a multi-state storage medium comprising more than two magnetic states; and
   a control mechanism to locally control a temperature and a magnetic field in a region of a selected magnetic bit and the magnetic storage material when data is written into the selected magnetic bit.

10. The device as in claim 9, wherein a second portion of the control mechanism is configured to control the temperature and comprises a laser and focuses a laser beam from the laser to a selected magnetic bit during writing.

11. The device as in claim 10, wherein the second portion of the control mechanism further comprises near-field optics to focus the laser beam.

12. The device as in claim 9, wherein a second portion of the control mechanism is configured to control the temperature and comprises a conducting scanning probe microcopy (SPM) tip which heats up a selected magnetic bit.

13. The device as in claim 9, wherein a second portion of the control mechanism is configured to control the temperature and comprises a resistive (ohmic) heating mechanism as part of each magnetic bit.

14. The device as in claim 9, wherein a second portion of the control mechanism is configured to control the temperature and includes a resistive (ohmic) heating element which is in contact with the selected magnetic bit.

15. The device as in claim 9, wherein a first portion of the control mechanism is configured to control the magnetic field and comprises:
   a magnetic or magneto-optical head to write to the magnetic storage material.

16. The device as in claim 9, wherein a first portion of the control mechanism is configured to control the magnetic field and comprises:

array of wire lines disposed so that two or more of the array of wire lines intersect in the region of the selected magnetic bit, wherein the array of wires is operated to write to the magnetic storage material.

17. The device as in claim 9, further comprising:
a readout mechanism to read a value of a remanent magnetization of the selected magnetic bit, wherein the value comprises one of a pre-determined set of remanent magnetizations for the multi-state storage medium.

18. The device as in claim 17, wherein the readout mechanism comprises:
a magnetic or magneto-optical head to read from the selected magnetic bit.

19. The device as in claim 17, wherein the readout mechanism comprises:
array of wire lines disposed so that two or more of the array of wire lines intersect in the region of the selected magnetic bit,
wherein a resistance of the two or more wires and a junction between the two or more wires corresponds to the value of the remanent magnetization value of the selected magnetic bit.

20. The device as in claim 9, wherein each of the magnetic bits having two domains of opposite directions of the exchange bias comprises a remanent magnetization of a selected value from a pre-determined set of remanent magnetizations for the multi-state storage medium.

21. The device as in claim 20, wherein amount of information stored in each of the magnetic bits having two domains of opposite directions of the exchange bias is equal to the number of levels in the pre-determined set of remanent magnetizations for the multi-state storage medium.

22. A method for providing more than two magnetic states in each magnetic bit of a magnetic storage material, the method comprising:
providing a magnetic storage material which comprises a ferromagnetic layer and an adjacent antiferromagnetic layer that are magnetically coupled to each other to store data at an operating temperature which is lower than a blocking temperature of the antiferromagnetic layer, wherein the blocking temperature is lower than a Curie temperature of the ferromagnetic material, and wherein each of magnetic bits in the material is formed by two domains of opposite directions of an exchange bias to constitute a multi-state storage medium comprising more than two magnetic states;
performing localized heating to raise temperature of a selected magnetic bit having two domains of opposite directions of the exchange bias in the material above the blocking temperature;
at the temperature above the blocking temperature, applying a magnetization process to the selected magnetic bit to set a remanent magnetization to a selected value of a pre-determined set of remanent magnetizations for the multi-state storage medium to write a bit;
removing the external magnetic field at the selected magnetic bit; and
at the zero field, reducing the temperature of the selected magnetic bit below the blocking temperature to store the remanent magnetization in the selected bit.

23. The method as in claim 22, further comprising maintaining the temperature of the selected magnetic bit below the blocking temperature when sensing the selected bit for readout.

24. The method as in claim 22, wherein:
the applied magnetization process for producing the remanent magnetization comprises:
applying a first magnetic field to the selected magnetization bit,
removing the first magnetic field from the selected magnetization bit, and
subsequently applying a second magnetic field, in a direction opposite to the first magnetic field, to the selected magnetization bit.

25. The method as in claim 22, wherein each of magnetic bits in the material is formed by two or more domains having opposite directions or opposite components of the exchange bias along a particular direction to constitute a multi-state storage medium.

26. A method for providing more than two magnetic states in each magnetic bit of a magnetic storage material, the method comprising:
providing a magnetic storage material which comprises a ferromagnetic layer and an adjacent antiferromagnetic layer that are magnetically coupled to each other to store data at an operating temperature which is lower than a blocking temperature of the antiferromagnetic layer, wherein the blocking temperature is lower than a Curie temperature of the ferromagnetic material, and wherein each of magnetic bits in the material is formed by two domains of opposite directions of an exchange bias to constitute a multi-state storage medium comprising more than two magnetic states;
performing localized heating to raise temperature of a selected magnetic bit in the material above the blocking temperature;
at the temperature above the blocking temperature, applying a magnetization process to the selected magnetic bit having two domains of opposite directions of the exchange bias to set a remanent magnetization to a selected value of a pre-determined set of remanent magnetizations for the multi-state storage medium to write a bit;
while maintaining a magnetic field of the magnetization process, reducing the temperature of the selected magnetic bit below the blocking temperature to store the remanent magnetization in the selected bit.

27. The method as in claim 26, further comprising maintaining the temperature of the selected magnetic bit below the blocking temperature when sensing the selected bit for readout.

28. The method as in claim 26, wherein:
the applied magnetization process for producing the remanent magnetization comprises:
applying a first magnetic field to the selected magnetization bit,
removing the first magnetic field from the selected magnetization bit, and
subsequently applying a second magnetic field, in a direction opposite to the first magnetic field, to the selected magnetization bit.

29. The method as in claim 26, wherein each of magnetic bits in the material is formed by two or more domains having opposite directions or opposite components of the exchange bias along a particular direction to constitute a multi-state storage medium.

30. A method comprising:
providing a magnetic storage material which comprises a ferromagnetic layer and an adjacent antiferromagnetic layer that are magnetically coupled to each other to provide a magnetic hysteresis loop as a binary-state magnetic storage medium;
storing information in the ferromagnetic layer of the magnetic storage material; and configuring the ferromagnetic layer and the adjacent antiferromagnetic layer to set the center of the magnetic hysteresis loop in a coordinate formed by a magnetic field as the horizontal axis and a magnetization as the vertical axis to be away from a position along the horizontal axis where the magnetic field is zero (H=0) by an amount greater than a stray magnetic field to stabilize each stored binary-state against a change of magnetization caused by the stray magnetic field.

31. The method as in claim 30, wherein the configuring further to stabilize each binary-state against a change of magnetization caused by thermal fluctuations.

32. A method comprising:
providing a magnetic storage material which comprises a ferromagnetic layer and an adjacent antiferromagnetic layer that are magnetically coupled to each other to provide a magnetic hysteresis loop as a binary-state magnetic storage medium;
storing information in the ferromagnetic layer of the magnetic storage material; and
configuring the ferromagnetic layer and the adjacent antiferromagnetic layer to enhance uniaxial anisotropy of the ferromagnetic layer and increase a squareness of the magnetic hysteresis loop to stabilize each stored binary-state against a change of magnetization caused by a stray magnetic field, wherein the squareness of the magnetic hysteresis loop comprises a ratio of remanent and saturated magnetizations.

33. The method as in claim 32, wherein the configuring further to stabilize each binary-state against a change of magnetization caused by thermal fluctuations.

34. A device comprising:
a magnetic storage material which comprises a ferromagnetic layer and an adjacent antiferromagnetic layer that are magnetically coupled to each other to store data in the ferromagnetic layer at an operating temperature which is lower than a blocking temperature of the antiferromagnetic layer,
wherein the blocking temperature is lower than a Curie temperature of the ferromagnetic material,
wherein the ferromagnetic layer and the antiferromagnetic layer are selected to enhance uniaxial anisotropy of the ferromagnetic layer and increase a squareness of the magnetic hysteresis loop of the magnetic storage material,
wherein the squareness of the magnetic hysteresis loop comprises a ratio of remanent and saturated magnetizations, and
wherein a width of the magnetic hysteresis loop that has increased squareness corresponds to a field greater than a stray magnetic field in the device; and
a control mechanism to locally control a temperature and a magnetic field in a region of a selected magnetic domain and the magnetic storage material when data is written into the selected magnetic domain.

35. The device as in claim 34, wherein a first portion of the control mechanism is configured to control the magnetic field and comprises:
a magnetic or magneto-optical head to read from and write to the magnetic storage material.

36. The device as in claim 34, wherein a first portion of the control mechanism is configured to control the magnetic field and comprises:
array of wire lines disposed so that two or more of the array of wire lines intersect in the region of the selected magnetic domain, wherein the array of wires is operated to read from and write to the magnetic storage material.

37. The device as in claim 34, wherein a second portion of the control mechanism is configured to control the temperature and comprises a laser and focuses a laser beam from the laser to a selected magnetic domain during writing.

38. The device as in claim 37, wherein the second portion of the control mechanism further comprises near-field optics to focus the laser beam.

39. The device as in claim 34, wherein a second portion of the control mechanism is configured to control the temperature and comprises a conducting scanning probe microcopy (SPM) tip which heats up a selected magnetic domain.

40. The device as in claim 34, wherein a second portion of the control mechanism is configured to control the temperature and comprises a resistive (ohmic) heating mechanism as part of each magnetic domain.

41. The device as in claim 34, wherein a second portion of the control mechanism is configured to control the temperature and includes a resistive (ohmic) heating element which is in contact with the selected magnetic domain.

* * * * *

UNITED STATES PATENT AND TRADEMARK OFFICE
CERTIFICATE OF CORRECTION

| | | |
|---|---|---|
| PATENT NO. | : 7,764,454 B2 | Page 1 of 1 |
| APPLICATION NO. | : 11/632335 | |
| DATED | : July 27, 2010 | |
| INVENTOR(S) | : Igor V. Roshchin et al. | |

It is certified that error appears in the above-identified patent and that said Letters Patent is hereby corrected as shown below:

On the Cover Page, item (75), under "Inventors:", in Column 1, Line 3, please delete "Asturias" and insert -- Lugones-Asturias --, therefor.

On Page 2, item (56), under "OTHER PUBLICATIONS", in Column 1, Line 37, please delete "anisotrophy," and insert -- anisotropy, --, therefor.

On Page 2, item (56), under "OTHER PUBLICATIONS", in Column 2, Line 12, please delete ""Opitcal" and insert -- "Optical --, therefor.

On Page 2, item (56), under "OTHER PUBLICATIONS", in Column 2, Line 23, please delete "Roshcin," and insert -- Roshchin, --, therefor.

In Column 3, Line 1, please delete "OF" and insert -- OF THE --, therefor.

In Column 3, Line 44, please delete "(T=80 K)" and insert -- (T=80 K). --, therefor.

In Column 5, Line 27, please delete "Roshschin" and insert -- Roshchin --, therefor.

In Column 7, Line 16, please delete "He(T)." and insert -- $H_e(T)$. --, therefor.

In Column 7, Line 19, please delete "$H_cT$)." and insert -- $H_e(T)$. --, therefor.

In Column 10, Line 10, please delete "He." and insert -- $H_e$. --, therefor.

Signed and Sealed this
Twenty-sixth Day of April, 2011

David J. Kappos
*Director of the United States Patent and Trademark Office*